(12) United States Patent
Lee et al.

(10) Patent No.: US 9,741,735 B2
(45) Date of Patent: Aug. 22, 2017

(54) VERTICAL MEMORY DEVICES HAVING CHARGE STORAGE LAYERS WITH THINNED PORTIONS

(71) Applicant: Samsung Electronics Co., Ltd., Suwon-Si, Gyeonggi-do (KR)

(72) Inventors: Hyun-Wook Lee, Gwacheon-si (KR); Daewoong Kang, Seoul (KR); Dae Sin Kim, Hwaseong-si (KR); Kwang Soo Seol, Seongnam-si (KR); Homin Son, Seoul (KR); Seunghyun Lim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/993,485

(22) Filed: Jan. 12, 2016

(65) Prior Publication Data

US 2016/0225786 A1 Aug. 4, 2016

(30) Foreign Application Priority Data

Feb. 2, 2015 (KR) .................. 10-2015-0016169

(51) Int. Cl.
*H01L 27/115* (2017.01)
*H01L 29/423* (2006.01)
(Continued)

(52) U.S. Cl.
CPC .. *H01L 27/11582* (2013.01); *H01L 21/28282* (2013.01); *H01L 29/4234* (2013.01); *H01L 29/42348* (2013.01); *H01L 27/11556* (2013.01)

(58) Field of Classification Search
None
See application file for complete search history.

(56) References Cited

U.S. PATENT DOCUMENTS 8,198,667 B2 6/2012 Kuniya et al.
8,445,347 B2 5/2013 Alsmeier
(Continued)

FOREIGN PATENT DOCUMENTS

JP 2011-023586 2/2011
JP 2012-146773 8/2012
KR 1020110108770 10/2011

OTHER PUBLICATIONS

Office action Appendix: English translation of the Detailed Description of Japanese Patent Application Kai, T. , Semiconductor Memory Device and Method of Manufacturing the same, (JP-2011-023586 A1), obtained from Japan Platform for Patent Information on Jan. 5, 2016,of which the original was made of record by Applicant in IDS filed Jan. 12, 2016.*

*Primary Examiner* — Johannes P Mondt
(74) *Attorney, Agent, or Firm* — Ward and Smith, P.A.

(57) ABSTRACT

A semiconductor device includes a stack comprising insulating patterns vertically stacked on a substrate and gate patterns interposed between the insulating patterns, an active pillar passing through the stack and electrically connected to the substrate and a charge storing layer interposed between the stack and the active pillar. The charge storing layer includes a first portion between the active pillar and one of the gate patterns, a second portion between the active pillar and one of the insulating patterns, and a third portion joining the first portion to the second portion and having a thickness less than that of the first portion.

18 Claims, 48 Drawing Sheets

(51) Int. Cl.
    *H01L 27/11582*    (2017.01)
    *H01L 21/28*       (2006.01)
    *H01L 27/11556*    (2017.01)

(56) References Cited

U.S. PATENT DOCUMENTS

| | | |
|---|---|---|
| 8,450,788 B2 | 5/2013 | Shim et al. |
| 8,476,713 B2 | 7/2013 | Lee et al. |
| 8,829,595 B2 | 9/2014 | Lee |
| 8,865,554 B2 | 10/2014 | Doo |
| 8,872,254 B2 | 10/2014 | Lee et al. |
| 8,946,808 B2 | 2/2015 | Lee et al. |
| 2012/0235220 A1 | 9/2012 | Sekine et al. |
| 2014/0070302 A1* | 3/2014 | Yoo .................. H01L 27/1157 257/324 |
| 2015/0333186 A1* | 11/2015 | Yoo .................. H01L 21/28282 257/324 |

\* cited by examiner

VERTICAL MEMORY DEVICES HAVING CHARGE STORAGE LAYERS WITH THINNED PORTIONS

CROSS-REFERENCE TO RELATED APPLICATIONS

This U.S. non-provisional patent application claims priority under 35 U.S.C. §119 to Korean Patent Application No. 10-2015-0016169, filed on Feb. 2, 2015, in the Korean Intellectual Property Office, the entire contents of which are hereby incorporated by reference.

BACKGROUND OF THE INVENTION

Example embodiments of the inventive concept relate to semiconductor devices and methods of fabricating the same, and in particular, to three-dimensional semiconductor devices and methods of fabricating the same.

Higher integration of semiconductor devices is desirable to satisfy consumer demands for superior performance and inexpensive prices. In the case of semiconductor devices, since integration is an important factor in determining product prices, increased integration is especially desirable. For typical two-dimensional or planar semiconductor memory devices, the degree of integration generally depends on the area occupied by a unit memory cell. Accordingly, the degree of integration is greatly influenced by the level of a fine pattern forming technology. However, expensive process equipment is typically needed to increase pattern fineness, which sets a practical limitation on increasing integration for two-dimensional or planar semiconductor devices.

To overcome such limitations, three-dimensional (3D) semiconductor devices including three-dimensionally-arranged memory cells have been proposed. However, there are significant manufacturing obstacles in achieving low-cost, mass-production of 3D semiconductor devices, particularly in the mass-fabrication of 3D devices that maintain or exceed the operational reliability of their 2D counterparts.

SUMMARY

Some embodiments provide a semiconductor device including a stack including insulating patterns vertically stacked on a substrate and gate patterns interposed between the insulating patterns, an active pillar passing through the stack and electrically connected to the substrate and a charge storing layer interposed between the stack and the active pillar. The charge storing layer includes a first portion between the active pillar and one of the gate patterns, a second portion between the active pillar and one of the insulating patterns, and a third portion joining the first portion to the second portion and having a thickness less than that of the first portion.

In some embodiments, the first portion may protrude towards the active pillar in relation to the second portion. The first portion may be the same thickness as the second portion or thinner than the second portion.

In some embodiments, the device further includes first blocking insulating regions between respective ones of the gate patterns and the charge storing layer and a tunnel insulating layer between the charge storing layer and the active pillar. Each of the first blocking insulating regions may include a first portion positioned between vertically adjacent ones of the insulating patterns and a second portion extending horizontally from the first portion and protruding toward the active pillar. Each of the second portions of the first insulating layers may overlap adjacent ones of the insulating patterns. In some embodiments, the second portions of the first insulating layers may contact the tunnel insulating layer.

In further embodiments, the device may further include second blocking insulating regions interposed between the gate patterns and the first blocking insulating regions. The second blocking insulating regions may include a material having a higher dielectric constant than that of the first blocking insulating regions.

In some embodiments, the device may further include an insulating gap-filling pattern in an internal space of the active pillar. A lower semiconductor pattern may be interposed between the substrate and the active pillar and in contact with the substrate. In some embodiments, the active pillar includes a first active pillar and the device further includes a second active pillar passing through the stack and spaced apart from the first active pillar, wherein the first and second active pillars are electrically connected at bottom ends thereof.

Additional embodiments provide a semiconductor device including a stack including insulating patterns vertically stacked on a substrate and gate patterns interposed between the insulating patterns, an active pillar passing through the stack and electrically connected to the substrate and a charge storing layer interposed between the stack and the active pillar and having spaced-apart protruding portions interposed between the gate patterns and the active pillar. The charge storage layer may be thinned on first and second sides of the protruding portions. The device may further include blocking insulating regions disposed on sidewalls of respective ones of the gate patterns and protruding into the active pillar. The protruding portions of the charge storing layer may be disposed on the blocking insulating regions.

Still further embodiments provide a semiconductor device including a stack including insulating patterns vertically stacked on a substrate and gate patterns interposed between the insulating patterns, an active pillar passing through the stack and electrically connected to the substrate, a first blocking insulating region on a sidewall of one of the gate patterns and protruding towards the active pillar, a charge storing layer on the first blocking insulating region and extending on to sidewalls of first and second ones of the insulating patterns adjacent the first blocking insulating region, the charge storage layer having first and second portions near locations where the first blocking insulating region contacts the first and second ones of the insulating patterns that are thinner than a third portion of the charge storage layer between the first and second portions, and a tunnel insulating layer interposed between the charge storing layer and the active pillar.

In some embodiments, the first blocking insulating region may extend into a space between the first and second ones of the insulating patterns. The device may further include a second blocking insulating region interposed between the gate patterns and the first blocking insulating region and including a material having a dielectric constant greater than that of the first blocking insulating region.

In some embodiments, the charge storing layer may include a portion that protrudes toward the active pillar between the active pillar and the one of the gate patterns.

In some embodiments, the first blocking insulating region may contact the tunnel insulating layer near the locations where the first blocking insulating region contacts the first and second ones of the insulating patterns.

In some method embodiments, insulating layers and sacrificial layers are alternately formed on a substrate to form a layered structure. A hole through the layered structure is formed to expose the substrate. Portions of the sacrificial layers exposed by the hole are oxidized to form first blocking insulating regions. A charge storing layer is formed on the first blocking insulating regions and a tunnel insulating layer is formed on the charge storing layer. A semiconductor layer is formed on the tunnel insulating layer to form an active pillar in the hole. The sacrificial layers are removed to form recesses between the insulating layers that expose the first blocking insulating regions. Portions of the charge storing layer in contact with the first blocking insulating regions are oxidized to expand the first blocking insulating regions towards the active pillar and thereby narrow portions of the charge storing layer near locations where the first blocking insulating regions contact the insulating layers. Second blocking insulating regions are formed on the first blocking insulating regions in the recesses and gate patterns are formed on the second blocking insulating regions in the recesses.

In some embodiments, oxidizing portions of the sacrificial layers exposed by the hole to form the first blocking insulating regions produces first blocking insulating regions that protrude into the hole.

In some embodiments, oxidizing portions of the sacrificial layers exposed by the hole to form first blocking insulating regions and oxidizing portions of the charge storing layer in contact with the first blocking insulating regions to expand the first blocking insulating regions towards the active pillar and thereby narrow portions of the charge storing layer near locations where the first blocking insulating regions contact the insulating layers include respective first and second radical oxidation processes. Each of the first and second radical oxidation processes may be performed at a temperature of 750-950° C. and under a pressure of 5-20 Torr, using mixture gas of hydrogen and oxygen.

In some embodiments, oxidizing portions of the charge storing layer in contact with the first blocking insulating regions to expand the first blocking insulating regions towards the active pillar and thereby narrow portions of the charge storing layer near locations where the first blocking insulating regions contact the insulating layers produces expanded first blocking insulation regions that contact the tunnel insulating layer.

In some embodiments, removing the sacrificial layers to form recesses between the insulating layers that expose the first blocking insulating regions includes forming a trench in the layered structure that is spaced apart from the hole and exposes the sacrificial layers and the substrate and selectively removing the exposed sacrificial layers to form the recesses that expose the first blocking insulating regions.

In further embodiments, the second blocking insulating regions may have a higher dielectric constant than the first blocking insulating regions.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 6A, 7A, and 9A through 14A are sectional views taken along line I-I' of FIG. 4 to illustrate a method of fabricating a semiconductor device, according to example embodiments of the inventive concepts.

FIGS. 6B, 7B, and 9B through 14B are enlarged views illustrating portions "A" of FIGS. 6A, 7A, and 9A through 14A, respectively.

FIGS. 18A through 23A are sectional views illustrating a semiconductor device according to even other example embodiments of the inventive concepts.

FIGS. 18B through 23B are enlarged views illustrating portions "A" of FIGS. 18A through 23A, respectively.

Figure 1:
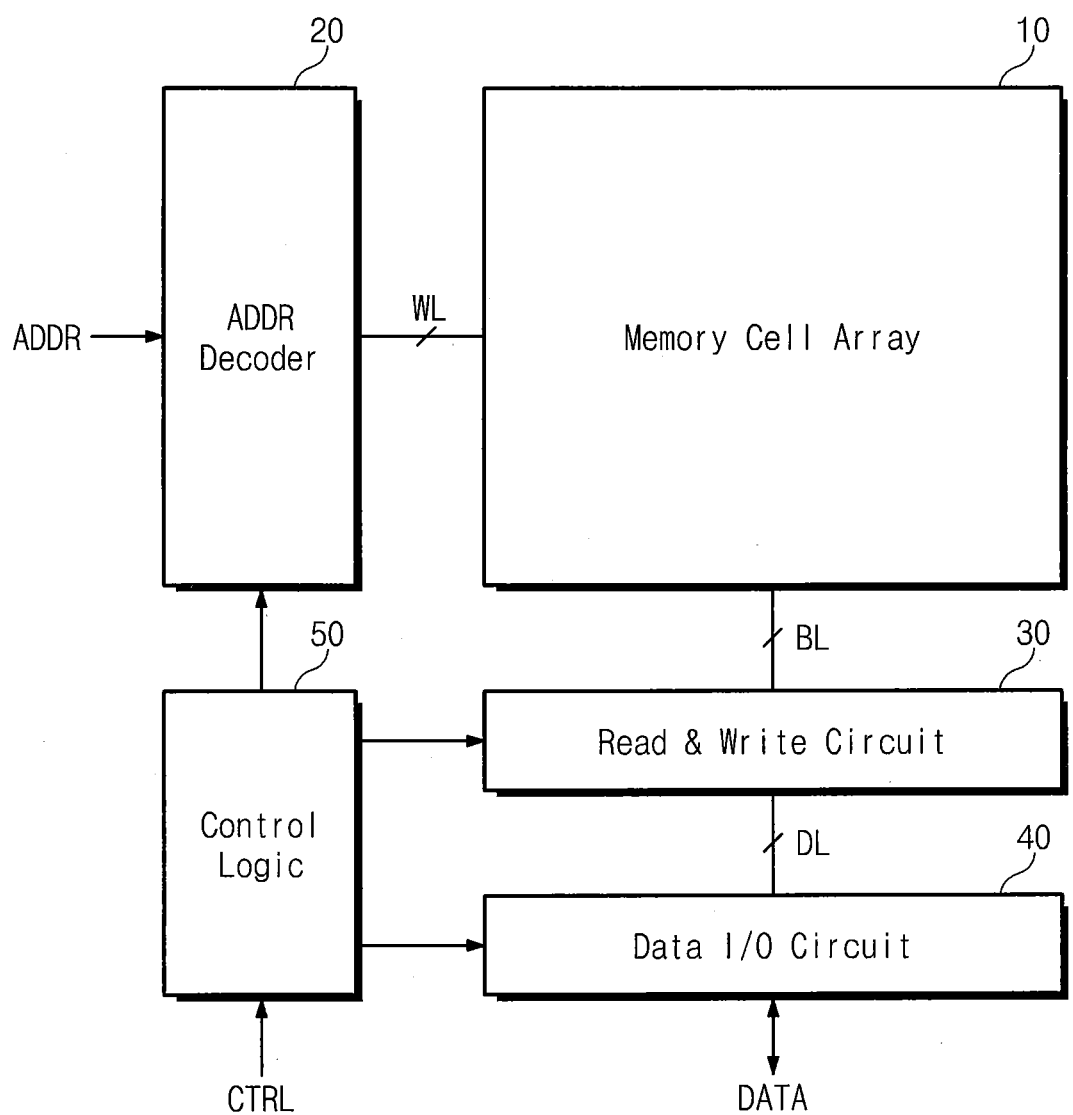
FIG. 1 is a block diagram illustrating a semiconductor device according to example embodiments of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements and, therefore, repetitive description thereof will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a block diagram illustrating a semiconductor device according to example embodiments of the inventive concept. The semiconductor device may include a memory cell array 10, an address decoder 20, a read/write circuit 30, a data input/output circuit 40, and a control logic 50.

The memory cell array 10 may be connected to the address decoder 20 via a plurality of word lines WL and may be connected to the read/write circuit 30 via a plurality of bit lines BL. The memory cell array 10 may include a plurality of memory cells. The memory cell array 10 may be configured to store one or more bits in each cell.

The address decoder 20 may be connected to the memory cell array 10 via the word lines WL. The address decoder 20 operates according to the control of the control logic 50. The address decoder 20 may receive an address ADDR. The address decoder 20 decodes a row address among the received address ADDR to select a corresponding word line from among the word lines WL. The address decoder 20 also decodes a column address among the address ADDR and transfers the decoded column address to the read/write circuit 30. The address decoder 20 may include various components, such as a row decoder, a column decoder, and address buffer.

The read/write circuit 30 may be connected to the memory cell array 10 via the bit lines BL, and be connected to the data input/output circuit 40 via the data lines DL. The read/write circuit 30 may operate under control of the control logic 50. The read/write circuit 30 receives the decoded column address from the address decoder 20. The read/write circuit 30 selects a bit line BL using the decoded column address. For example, the read/write circuit 30 receives data from the data input/output circuit 40 and writes the received data in the memory cell array 10. The read/write circuit 30 reads data from the memory cell array 10 and transfers the read data to the data input/output circuit 40. The read/write circuit 30 reads data from a first storage region of the memory cell array 10, and writes the read data in a second storage region of the memory cell array 10. For example, the read/write circuit 30 may perform a copy-back operation.

The read/write circuit 30 may include elements which include a page buffer (or a page register) and a column selection circuit. As another example, the read/write circuit 30 may include elements which include a sensing amplifier, a write driver and a column selection circuit.

The data input/output circuit 40 may be connected to the read/write circuit 30 via the data lines DL. The data input/output circuit 40 operates according to the control of the control logic 50. The data input/output circuit 40 exchanges data DATA with the outside. The data input/output circuit 40 transfers the data DATA to the read/write circuit 30 via the data lines DL. The data input/output circuit 40 outputs the data DATA, which is transferred from the read/write circuit 30 through the data lines DL, to the outside. For example, the data input/output circuit 40 may include an element such as a data buffer.

The control logic 50 may be connected to the address decoder 20, the read/write circuit 30 and the data input/output circuit 40. The control logic 50 controls the operation of a 3D semiconductor device. The control logic 50 may operate in response to a control signal CTRL transferred from the outside.

Figure 2:
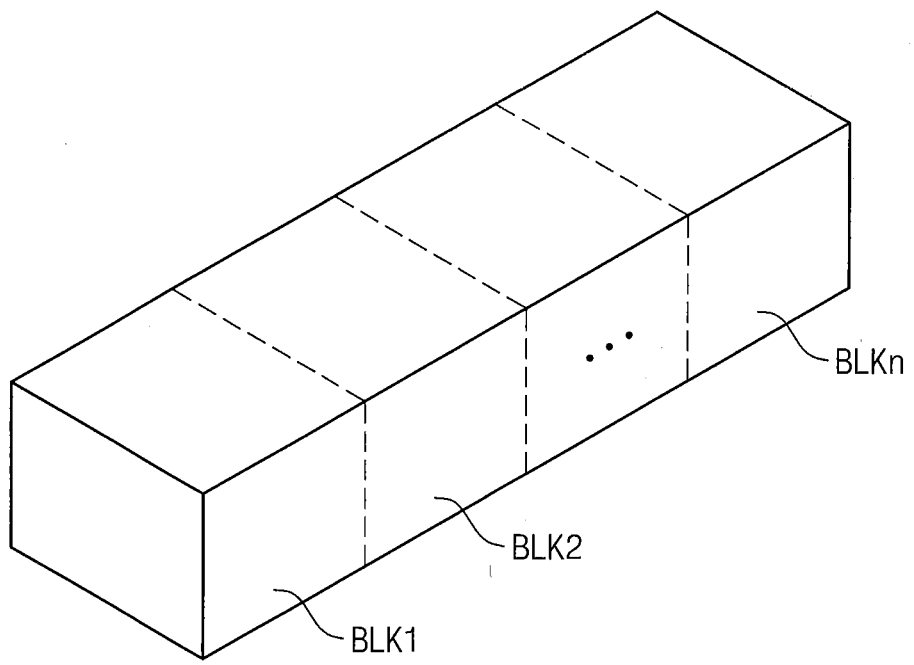
FIG. 2 is a block diagram illustrating an example of a memory cell array of FIG. 1.

FIG. 2 is a block diagram illustrating an example of a memory cell array of FIG. 1. Referring to FIG. 2, the memory cell array 10 may include a plurality of memory blocks BLK1 to BLKn. Each of the memory blocks BLK1 to BLKn may have a three-dimensional (3D) or "vertical" structure. For example, the each of the memory blocks BLK1 to BLKn may include structures that extend in first, second and third directions D1, D2, and D3. For example, the each of the memory blocks BLK1 to BLKn may include a plurality of cell strings that extend along the third direction D3.

Figure 3:
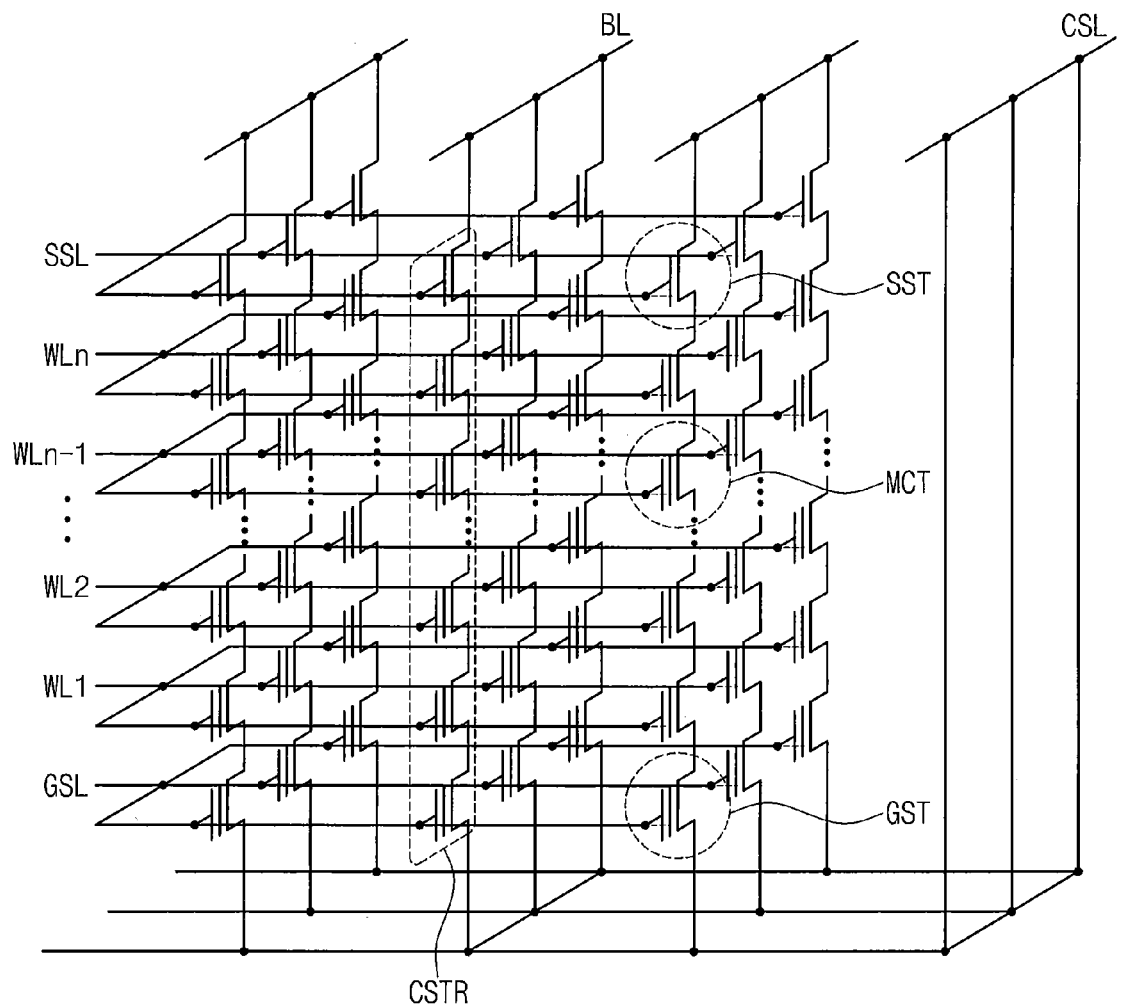
FIG. 3 is a circuit diagram schematically illustrating a cell array of a memory block of FIG. 2, according to example embodiments of the inventive concepts.

FIG. 3 is a circuit diagram schematically illustrating a cell array of a memory block of FIG. 2, according to example embodiments of the inventive concept. The semiconductor device may include a common source line CSL, bit lines BL, and a plurality of cell strings CSTR disposed between the common source line CSL and the bit lines BL. Groups of the cell strings CSTR may be connected in parallel to respective ones of the bit lines BL.

Each of the cell strings CSTR may include the ground selection transistor GST coupled to the common source line CSL, the string selection transistor SST coupled to each of the bit lines BL, and the plurality of memory cell transistors MCT interposed between the selection transistors GST and SST. The ground selection transistor GST, the string selection transistor SST, and the memory cell transistors MCT may be connected in series. A ground selection line GSL, a plurality of word lines WL1-WLn, and a string selection line SSL may serve as gate electrodes of the ground selection transistor GST, the memory cell transistors MCT, and the string selection transistor SST, respectively.

Figure 4:
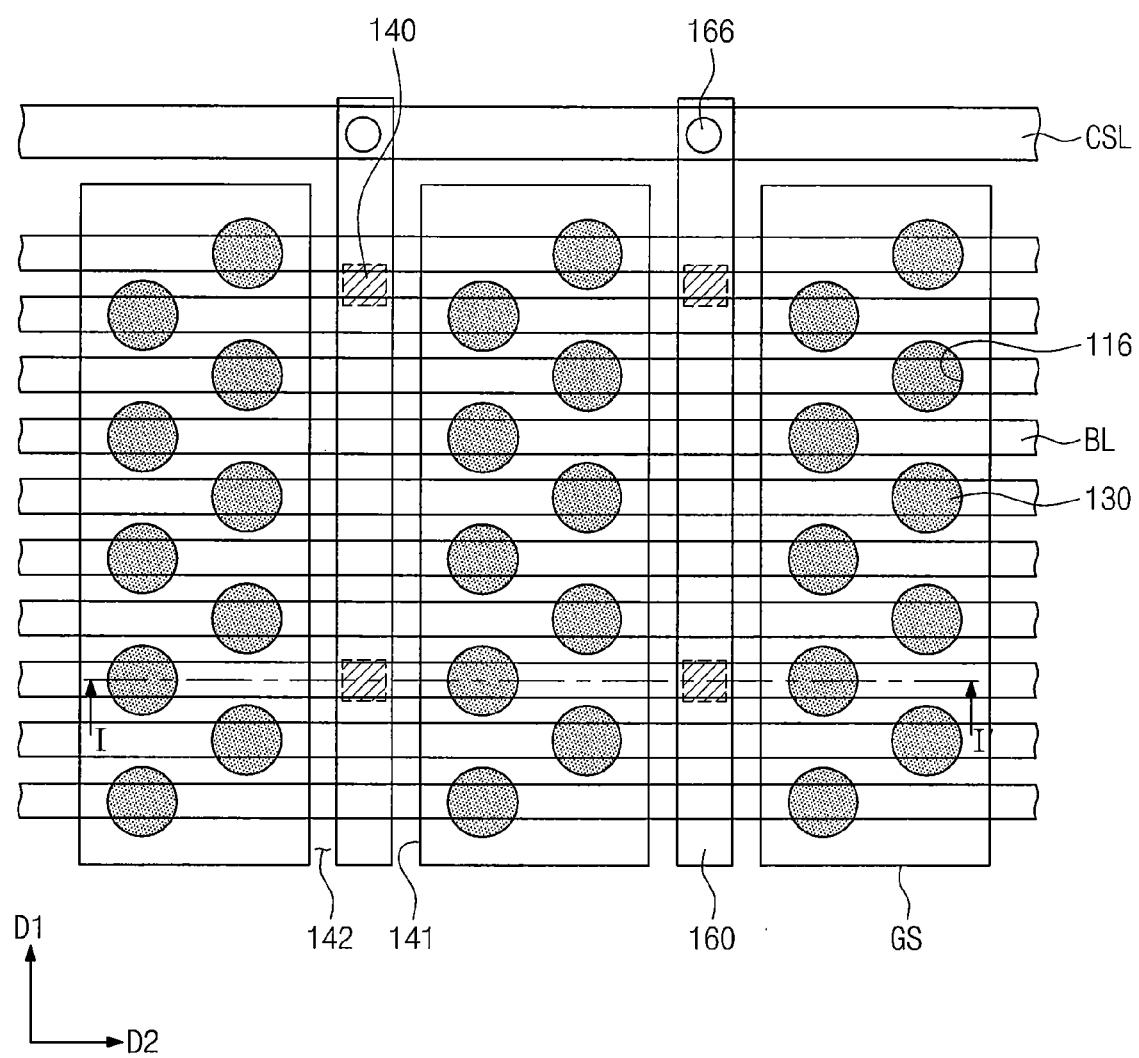
FIG. 4 is a plan view illustrating a semiconductor device according to example embodiments of the inventive concepts.
Figure 5A:
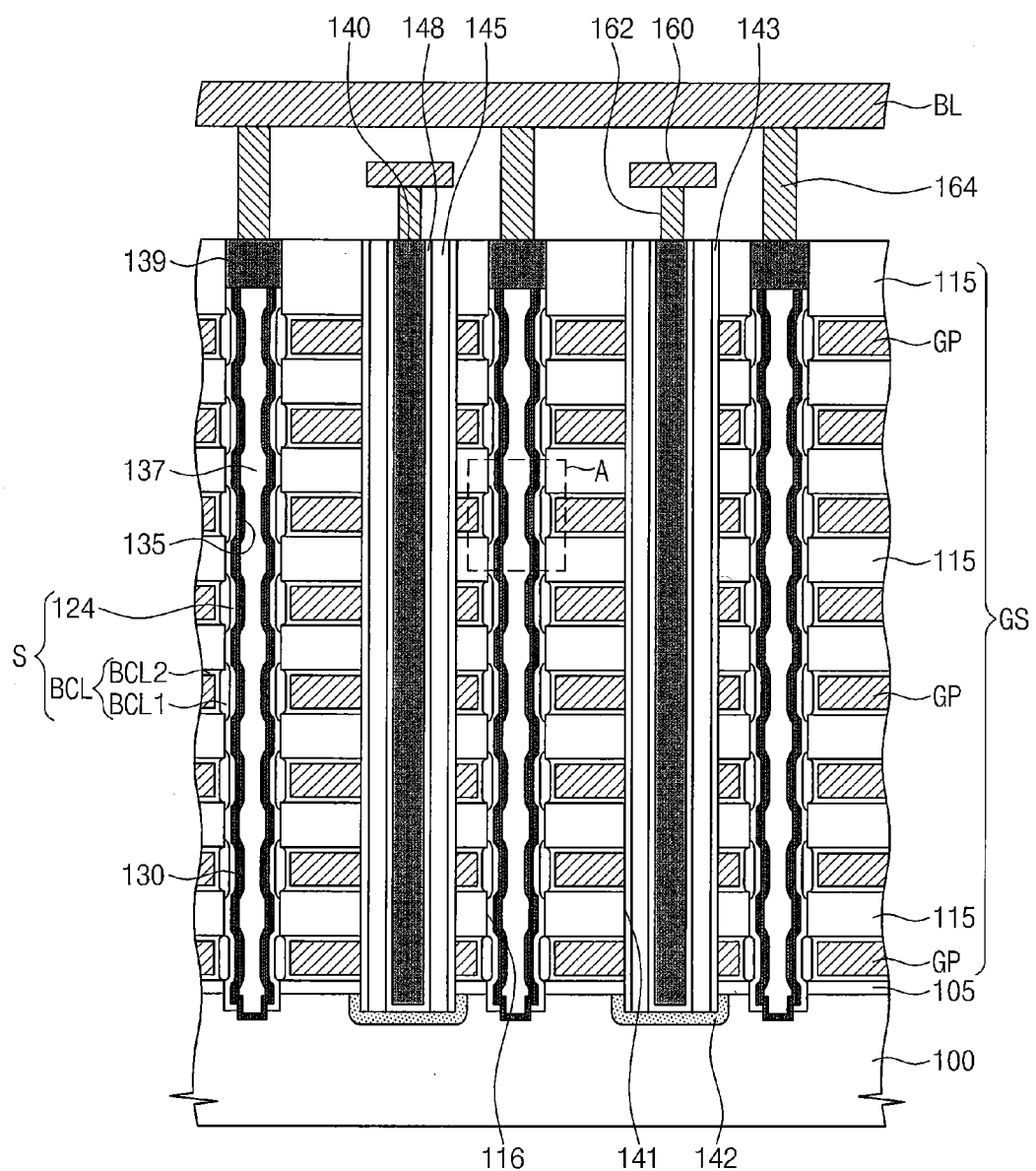
FIG. 5A is a sectional view taken along line I-I' of FIG. 4 to illustrate a semiconductor device according to example embodiments of the inventive concepts.
Figure 5B:
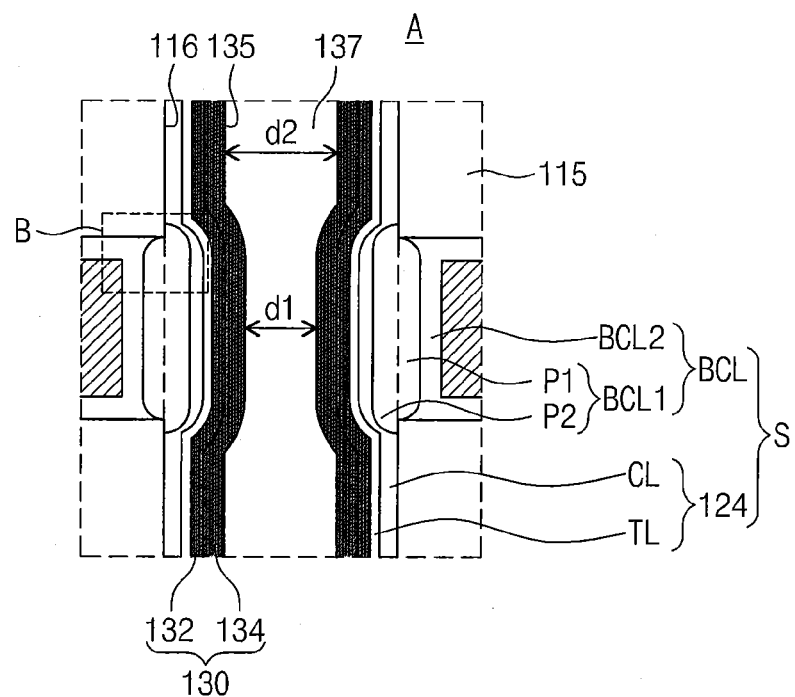
FIG. 5B is an enlarged view illustrating a portion "A" of FIG. 5A, and FIGS. 5C and 5D are enlarged views illustrating a portion "B" of FIG. 5B.
Figure 5C:
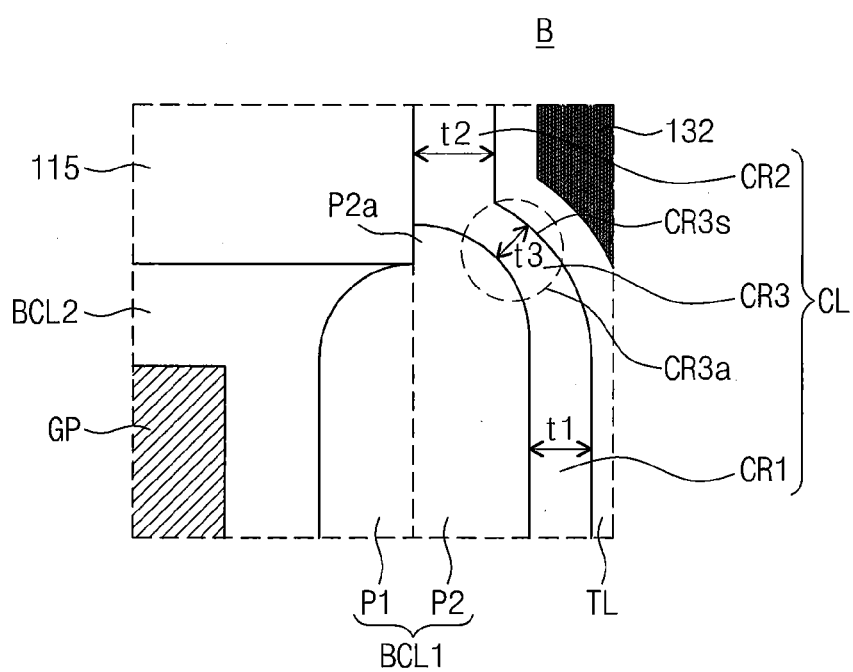
Figure 5D:
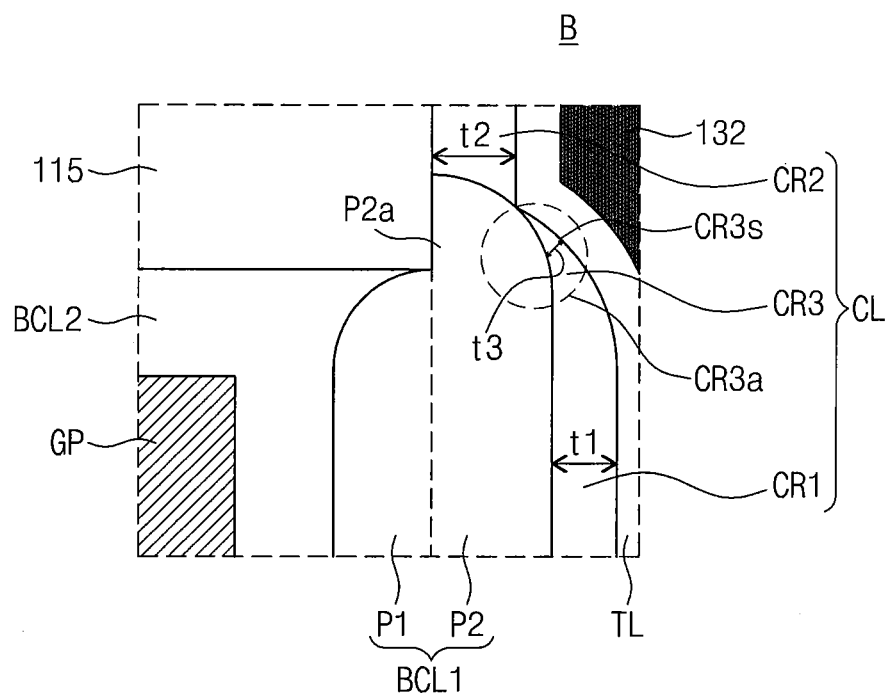

FIG. 4 is a plan view illustrating a semiconductor device according to example embodiments of the inventive concept. FIG. 5A is a sectional view taken along line I-I' of FIG. 4, FIG. 5B is an enlarged view illustrating a portion "A" of FIG. 5A, and FIGS. 5C and 5D are enlarged views illustrating a portion "B" of FIG. 5B.

Referring to FIG. 4 and FIGS. 5A-5D, stacks GS may be provided on a substrate 100. The substrate 100 may be a semiconductor substrate having a first conductivity type (e.g., p-type). The semiconductor substrate 100 may include at least one of a single crystalline silicon layer, a silicon on insulator (SOI) wafer, a silicon layer formed on a silicon germanium (SiGe) layer, a single crystalline silicon layer formed on an insulating layer, and a poly crystalline silicon layer formed on an insulating layer.

The stacks GS may include insulating patterns 115 and gate patterns GP vertically stacked on the substrate 100, which respective ones of the gate patterns GP interposed between adjacent ones of the insulating patterns 115. The insulating patterns 115 may include, for example, silicon oxide layers. The gate patterns GP may include at least one of doped silicon, metals (e.g., tungsten), metal nitrides, and metal sificides. When viewed in a plan view, the stacks GS may have a linear shape and extend in parallel along a first direction D1. In example embodiments, a plurality of spaced-apart stacks GS may be provided to be spaced apart from each other in a second direction D2 crossing (e.g., perpendicular to) the first direction D1. Furthermore, a lower insulating layer 105 may be provided between the substrate 100 and the stack GS. The lower insulating layer 105 may include, for example, a silicon oxide layer. The lower insulating layer 105 may be thinner than the insulating patterns 115 provided thereon.

In example embodiments, at least one (e.g., the lowermost and uppermost ones) of the gate patterns GP may serve as gate electrodes of the ground and string selection transistors GST and SST described with reference to FIG. 1. For example, in a 3D NAND flash memory device, the uppermost gate pattern may be used as the gate electrode of the string selection transistor controlling electrical connection between a bit line BL and active pillars 130, and the lowermost gate pattern may be used as the gate electrode of the ground selection transistor controlling electrical connection between common source regions 142 formed in the substrate 100 and the active pillars 130.

The stack GS may have a plurality of vertical holes 116 through the gate patterns GP to the substrate 100. In example embodiments, when viewed in a plan view, the vertical holes 116 may be arranged in a zigzag arrangement along the first direction D1. However, the arrangement of the vertical holes 116 may not limited thereto and may be variously modified.

Respective active pillars 130 may be disposed in respective ones of the vertical holes 116. The active pillars 130 may pass through the gate patterns GP and contact the substrate 100. In example embodiments, the active pillars 130 may include a semiconductor material. Respective conductive pads 139 may be provided on the active pillars 130. The conductive pads 139 may include, for example, doped semiconductor regions and/or other types of conductive materials. The active pillar 130 may include channel regions for the MOS transistors of the strings.

In example embodiments, the active pillars 130 may have a pipe-like shape with a closed lower end. For example, the active pillar 130 may include a first semiconductor pattern 132 provided on a sidewall of the vertical hole 116 and a second semiconductor pattern 134 provided on a sidewall of the first semiconductor pattern 132. The first semiconductor pattern 132 may have a pipe-like shape with open upper and lower ends. The first semiconductor pattern 132 may be spaced apart from the substrate 100. The second semiconductor pattern 134 may have a pipe-like shape with a closed lower end and an open upper end. The second semiconductor pattern 134 may be in contact with an inner sidewall of the first semiconductor pattern 132 and the top surface of the substrate 100. Accordingly, an inner sidewall of the second semiconductor pattern 134 may define a space 135.

In example embodiments, each of the first and second semiconductor patterns 132 and 134 may include at least one of polycrystalline silicon, single crystalline silicon, and amorphous silicon. The first and second semiconductor patterns 132 and 134 may be in an undoped state or may be doped to have the same conductivity type as the substrate 100.

A section profile of an inner sidewall of the active pillar 130 may be similar to that of an inner sidewall of a charge storing layer CL, as will be described in more detail below. In other words, the inner sidewall of the active pillar 130 (i.e., the sidewall of the internal space 135) may include a bending portion. Accordingly, the internal space 135 may include portions having at least two different diameters. As an example, the internal space 135 may include first portions, which are positioned at the same levels as those of first regions CR1 of the charge storing layer CL to have a first diameter d1, and second portions, which are positioned at the same levels as those of second regions CR2 of the charge storing layer CL to have a second diameter d2 larger than the first diameter d1. The internal space 135 may be filled with an insulating gap-filling pattern 137. The insulating gap-filling pattern 137 may include, for example, a silicon oxide layer. Since the internal space 135 is formed to have a sidewall including the bending portion, the insulating gap-filling pattern 137 filling the internal space 135 may also include portions having at least two different diameters. For example, the insulating gap-filling pattern 137 may have a first width, which is equivalent to the first diameter d1, at the same levels as the first regions CR1 of the charge storing layer CL and a second width, which is equivalent to the second diameter d2, at the same levels as the second regions CR2 of the charge storing layer CL.

A data storing element S may be provided between the stack GS and the active pillar 130. The data storing element S may include a blocking insulating region BCL adjacent to the stack GS, a tunnel insulating layer TL adjacent to the active pillars 130, and a charge storing layer CL interposed therebetween. The data storing element S may be referred to as a data storing layer.

In example embodiments, the blocking insulating region BCL may include a first blocking insulating region BCL1 and a second blocking insulating region BCL2. As an example, the first blocking insulating region BCL1 may be a silicon oxide region, and the second blocking insulating region BCL2 may be a high-k dielectric region (e.g., an aluminum oxide layer and/or a hafnium oxide layer).

In detail, the first blocking insulating region BCL1 may be an isolated pattern that is disposed between the gate patterns GP and the charge storing layer CL. The first blocking insulating region BCL1 may include a first portion P1, which is positioned between the insulating patterns 115 adjacent to each other in a vertical direction, and a second portion P2, which horizontally extends from the first portion P1 into the vertical hole 116. In other words, the first blocking insulating region BCL1 may be isolated on the sidewall of the vertical hole 116. For example, when viewed in a vertical cross-section, the first blocking insulating region BCL1 may be overlapped with a corresponding one of the gate patterns GP and may be locally provided between vertically adjacent pairs of the insulating patterns 115. The second portion P2 may have a portion P2a overlapping the insulating patterns 115 adjacent thereto. Accordingly, the second portion P2 may have a greater vertical extent than a vertical distance between the adjacent pairs of the insulating patterns 115.

The second blocking insulating region BCL2 may be provided between a corresponding pair of the gate pattern GP and the first blocking insulating region BCL1. The second blocking insulating region BCL2 may extend between the gate pattern GP and the insulating patterns 115 adjacent thereto to cover top and bottom surfaces of the gate patterns GP.

The charge storing layer CL may be a charge trap layer or an insulating layer with conductive nanoparticles. In more detail, the charge storing layer CL may include at least one of, for example, a silicon nitride layer, a silicon oxynitride layer, a silicon-rich nitride layer, and a nanocrystalline silicon layer. The charge storing layer CL may be disposed on the sidewall of the vertical hole 116 provided with the first blocking insulating region BCL1. In other words, the charge storing layer CL may cover the inner sidewall of the first blocking insulating region BCL1 protruding into the vertical hole 116 and extend in the vertical direction along the sidewall of the vertical hole 116. Accordingly, in vertical cross-section, the charge storing layer CL may have a vertical, but partially-bending, profile with respect to the substrate 100.

In detail, the charge storing layer CL may include first regions CR1 interposed between the gate patterns GP and the active pillar 130, second regions CR2 interposed between the insulating patterns 115 and the active pillar 130, and third regions CR3 connecting the first regions CR1 to the second regions CR2. Each of the first regions CR1 may be a portion of the charge storing layer CL, which has a first thickness t1 and is in contact with the first blocking insulating region BCL1, and each of the second regions CR2 may be a portion of the charge storing layer CL, which has a second thickness t2 and is in contact with the insulating patterns 115. In example embodiments, the first thickness t1 may be less than or substantially equal to the second thickness t2. The first and second thicknesses t1 and t2 may be substantially uniform, but example embodiments of the inventive concept may not be limited thereto. Furthermore, the first regions CR1 may horizontally protrude from the second regions CR2. In other words, the first regions CR1 of the charge storing layer CL may be recessed towards the active pillar 130.

The third regions CR3 may be defined as a portion that is positioned adjacent to the overlapping portions P2a of the first blocking insulating region BCL1 and has a thickness less than that of the first and second regions CR1 and CR2. In example embodiments, as shown in FIG. 5C, the third regions CR3 may include a portion CR3a thinner than the first regions CR1 (i.e., t3<t1). In other words, at least a portion of the third regions CR3 may have a third thickness t3 that is less than the first thickness t1 of the first regions CR1. Such a portion of the third regions CR3 may be in contact with the overlapping portions P2a of the first blocking insulating region BCL1. In sum, the charge storing layer CL may have an inner sidewall CR3s, which is positioned adjacent to the overlapping portions P2a of the first blocking insulating region BCL1 and has a bending profile, and a thinned portion CR3a, which is positioned adjacent to the overlapping portions P2a of the first blocking insulating region BCL1. In other example embodiments, as shown in FIG. 5D, the overlapping portions P2a of the first blocking insulating region BCL1 may pierce through the third regions CR3 and may be in contact with the tunnel insulating layer TL.

The tunnel insulating layer TL may be formed of at least one insulating layer and may have a band gap that is greater than that of the charge storing layer CL. As an example, the tunnel insulating layer TL may be a silicon oxide layer. The tunnel insulating layer TL may be provided on the sidewall of the charge storing layer CL and may have substantially the same cross-section profile as the charge storing layer CL. The tunnel insulating layer TL, in conjunction with the charge storing layer CL, may serve as a vertical insulating pattern 124. As described above, the vertical insulating pattern 124 may generally extend perpendicularly with respect to the substrate 100, but may include multiple bends.

An isolation trench 141 extending in the first direction D1 may be provided between adjacent pairs of the stacks GS. A common source region 142 may be provided in a portion of the substrate 100 exposed by the isolation trench 141. The common source region 142 may extend parallel to the first direction D1, in the substrate 100. The common source region 142 may have a second conductivity type (e.g., n-type) different from the first conductivity type. A device isolation pattern 145 may be provided on the common source regions 142 in the isolation trench 141. The device isolation pattern 145 may include, for example, a silicon oxide layer.

Common contacting layers (not shown) may be provided between the device isolation pattern 145 and the common source regions 142. The common contacting layers may include, for example, a metal-semiconductor compound layer, such as a metal silicide layer. Insulating spacers 143 may be provided on the sidewalls of the stacks GS, between the sidewalls of the stacks OS and the device isolation patterns 145. The insulating spacers 143 may include at least one of a silicon oxide layer, a silicon oxynitride layer, a silicon nitride layer, and an aluminum oxide layer.

Strapping plugs 140 may pass through holes defined by the device isolation patterns 145 and be electrically connected to the common source regions 142. The strapping plugs 140 may be spaced apart along the first direction D1. Barrier layers 148 may be provided between the strapping plugs 140 and the device isolation patterns 145. The strapping plugs 140 may include a metallic layer (e.g., of tungsten, copper and/or aluminum). The barrier layers 148 may include a conductive metal nitride layer (e.g., of titanium nitride and/or tantalum nitride). The common contacting layers (not shown) may be provided between the strapping plugs 140 and the common source regions 142.

Strapping lines 160 may be provided on the device isolation patterns 145 and may extend parallel to the first direction D1. The strapping lines 160 may be electrically connected to the strapping plugs 140 through the first contacts 162. The strapping lines 160 and the first contacts 162 may include at least one of metals (e.g., tungsten, copper, and/or aluminum), conductive metal nitrides (e.g., titanium nitride and/or tantalum nitride), and transition metals (e.g., titanium and/or tantalum).

The bit lines BL may be disposed above the strapping lines 160 and may extend in parallel along the second direction D2. The bit lines BL may be electrically connected to the active pillars 130 through second contacts 164. The bit lines BL and the second contacts 164 may include at least one of metals (e.g., tungsten, copper, aluminum), conductive metal nitrides (e.g., titanium nitride and/or tantalum nitride), and transition metals (e.g., titanium and/or tantalum).

The common source line CSL may be disposed on the strapping lines 160 and may extend along the second direction D2. The common source line CSL may be electrically connected to the strapping lines 160 through third contacts 166. The common source line CSL and the third contacts 166 may include at least one of metals (e.g., tungsten, copper, and/or aluminum), conductive metal nitrides (e.g., titanium nitride and/or tantalum nitride), and transition metals (e.g., titanium and/or tantalum).

According to example embodiments of the inventive concept, a charge storing layer may penetrate gate patterns vertically stacked on a substrate and have a bending or winding profile. Furthermore, the charge storing layer may include portions with a reduced thickness is between the gate patterns. This makes it possible to reduce vertical spreading of electric charges trapped in the charge storing layer. This can improve a charge retention property of the vertical-type FLASH memory device. As a result, the vertical-type FLASH memory device can have improved reliability.

Hereinafter, the method of fabricating a semiconductor device according to example embodiments of the inventive concept will be described. FIGS. 6A, 7A, and 9A through 14A are sectional views taken along line I-I' of FIG. 4 to illustrate a method of fabricating a semiconductor device, according to example embodiments of the inventive concept. FIGS. 6B, 7B, and 9B through 14B are enlarged views illustrating portions "A" of FIGS. 6A, 7A, and 9A through 14A, respectively. FIGS. 13C and 13D are enlarged views illustrating a portion "B" of FIG. 13B. FIG. 8 is a graph showing a relation between thicknesses and vertical positions of first preliminary insulating layers.

Figure 6A:
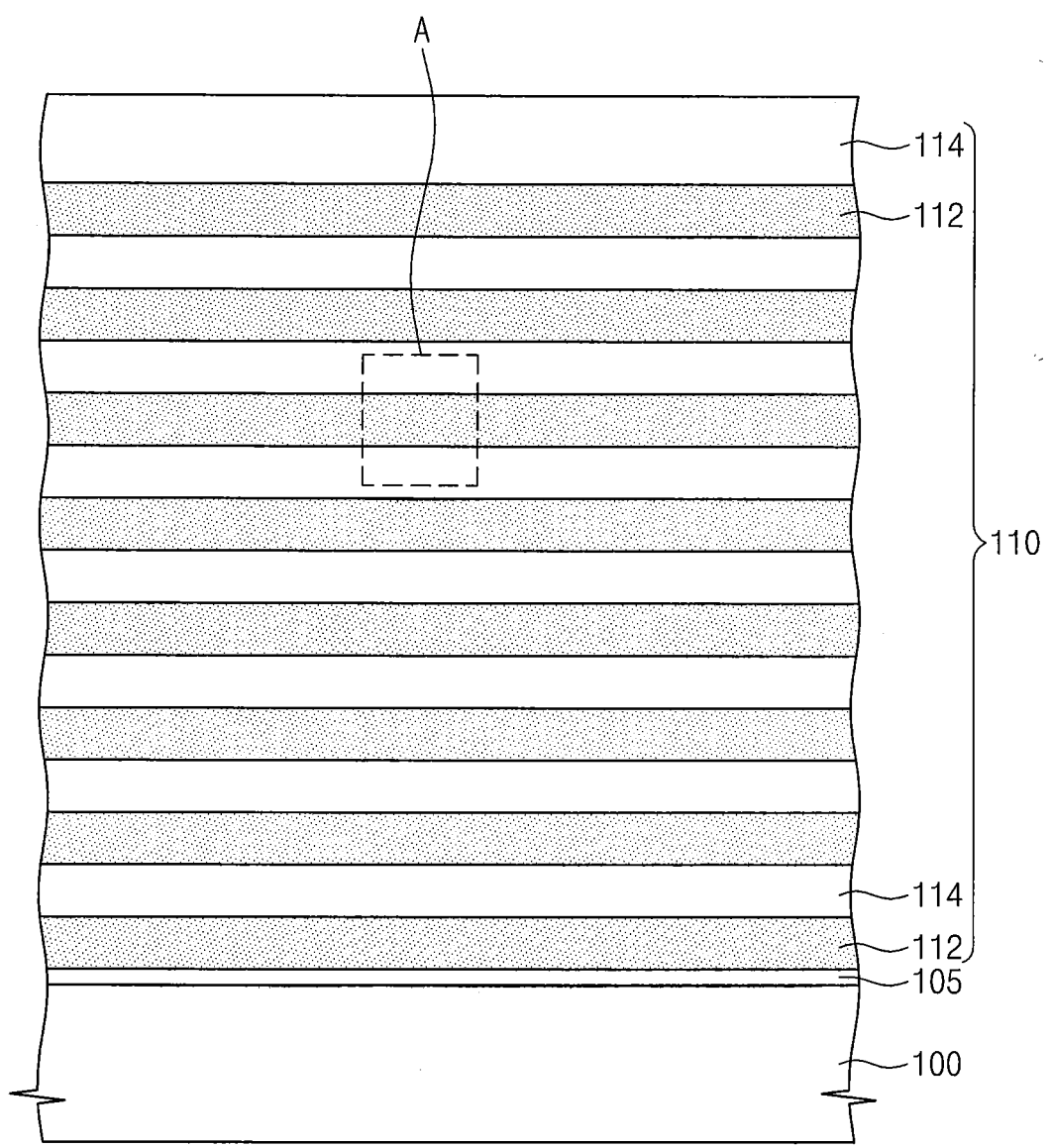
Figure 6B:
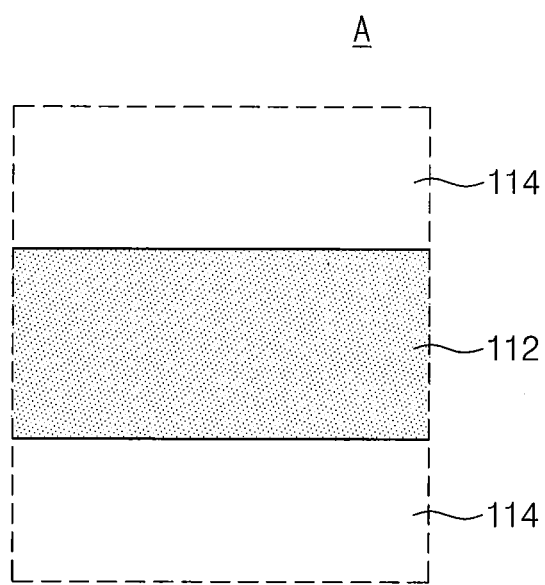

Referring to FIGS. 6A and 6B, sacrificial layers 112 and insulating layers 114 may be alternately stacked on the substrate 100 to form a layered structure 110. The substrate 100 may be a semiconductor substrate having a first conductivity type (e.g., p-type). The semiconductor substrate may include at least one of a single crystalline silicon layer, a silicon on insulator (SOI) wafer, a silicon layer formed on a silicon germanium (SiGe) layer, a single crystalline silicon layer formed on an insulating layer, and a poly crystalline silicon layer formed on an insulating layer.

The sacrificial layers 112 may include a material that has a high etch selectivity with respect to the insulating layers 114. In example embodiments, materials for the sacrificial layers 112 and the insulating layers 114 may be selected in such a way that they are etched to have a high etch selectivity in a wet etching process using chemical solution and a low etch selectivity in a dry etching process using etching gas. In example embodiments, the sacrificial layers 112 may have substantially the same thickness. However, in other example embodiments, the uppermost and lowermost ones of the sacrificial layers 112 may be thicker than the others. The insulating layers 114 may have substantially the same thickness, but in other example embodiments, at least one (e.g., the uppermost one) of the insulating layers 114 may have a different thickness than the others. The sacrificial layers 112 and the insulating layers 114 may be formed using, for example, a chemical vapor deposition (CVD) process.

In example embodiments, the sacrificial layers 112 and the insulating layers 114 may be formed of insulating materials having different etch rates for a specific etchant. The sacrificial layers 112 may include at least one of, for example, a silicon layer, a silicon carbide layer, a silicon oxynitride layer, and a silicon nitride layer. The insulating layers 114 may be at least one of a silicon layer, a silicon oxide layer, a silicon carbide layer, a silicon oxynitride layer, and a silicon nitride layer, but it may be formed of a material selected to be different from the sacrificial layers 112. For example, the sacrificial layers 112 may be formed of a silicon nitride layer, and the insulating layers 114 may be formed of a silicon oxide layer. In other example embodiments, the sacrificial layers 112 may be formed of a silicon layer, and the insulating layers 114 may be formed of a silicon oxide layer.

Furthermore, the lower insulating layer 105 may be formed between the substrate 100 and the layered structure 110. For example, the lower insulating layer 105 may include a silicon oxide layer, which may be formed by a thermal oxidation process and/or a deposition process. The lower insulating layer 105 may be thinner than the sacrificial layers 112 and the insulating layers 114.

Figure 7A:
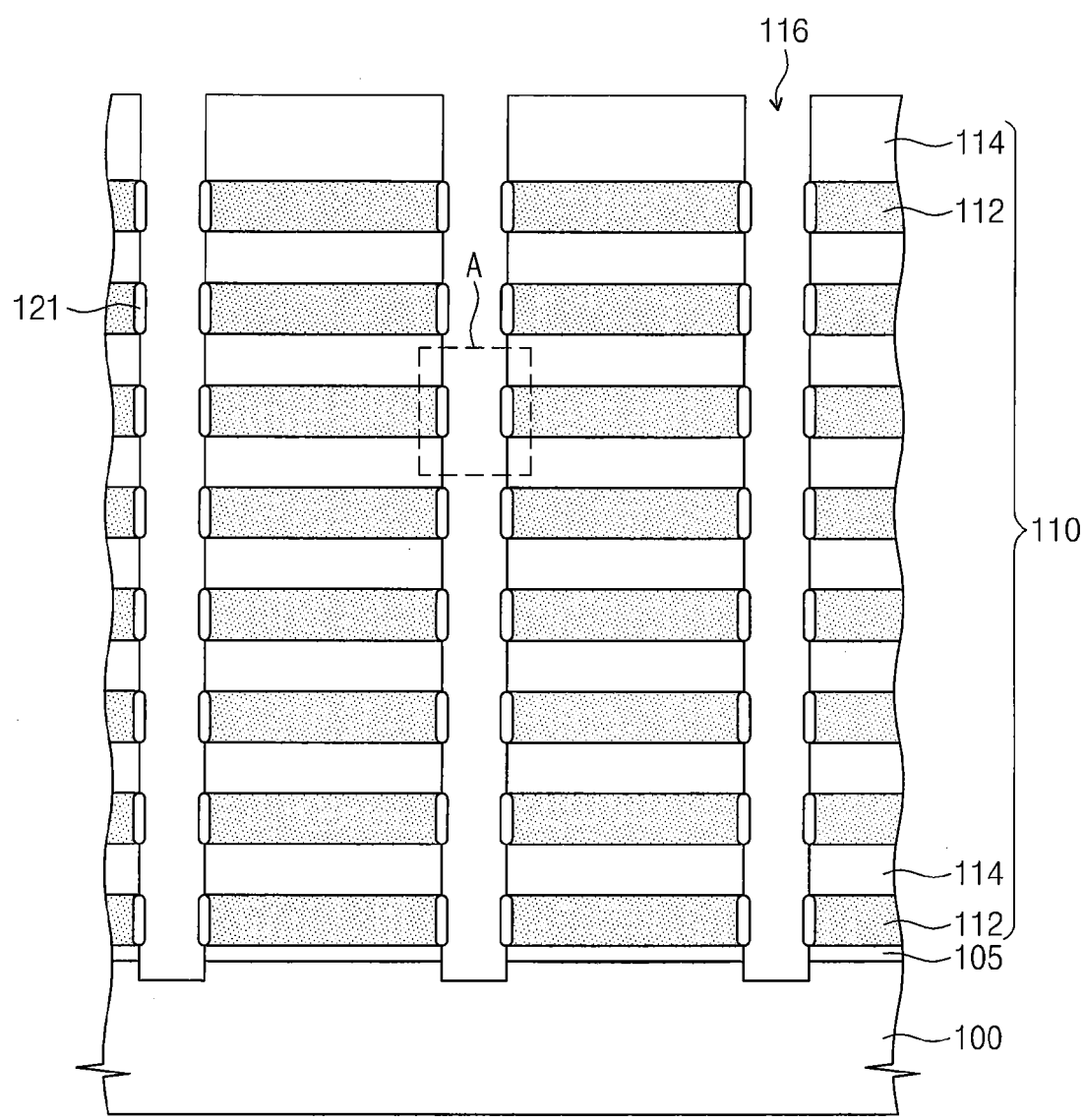
Figure 7B:
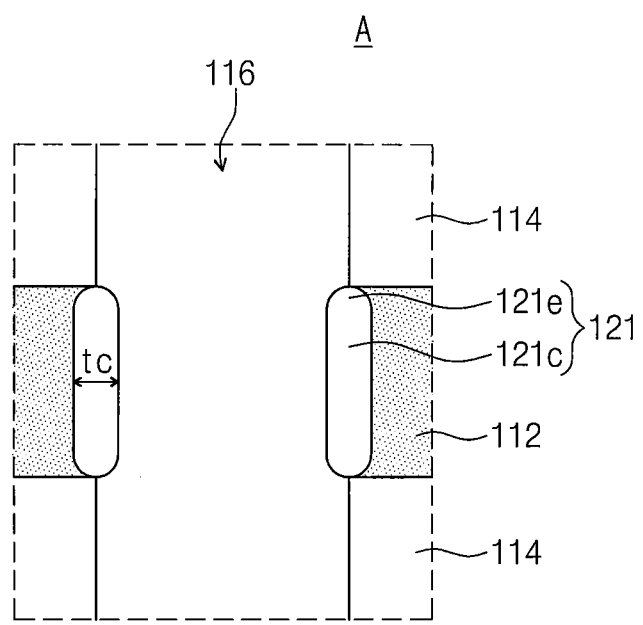
Figure 8:
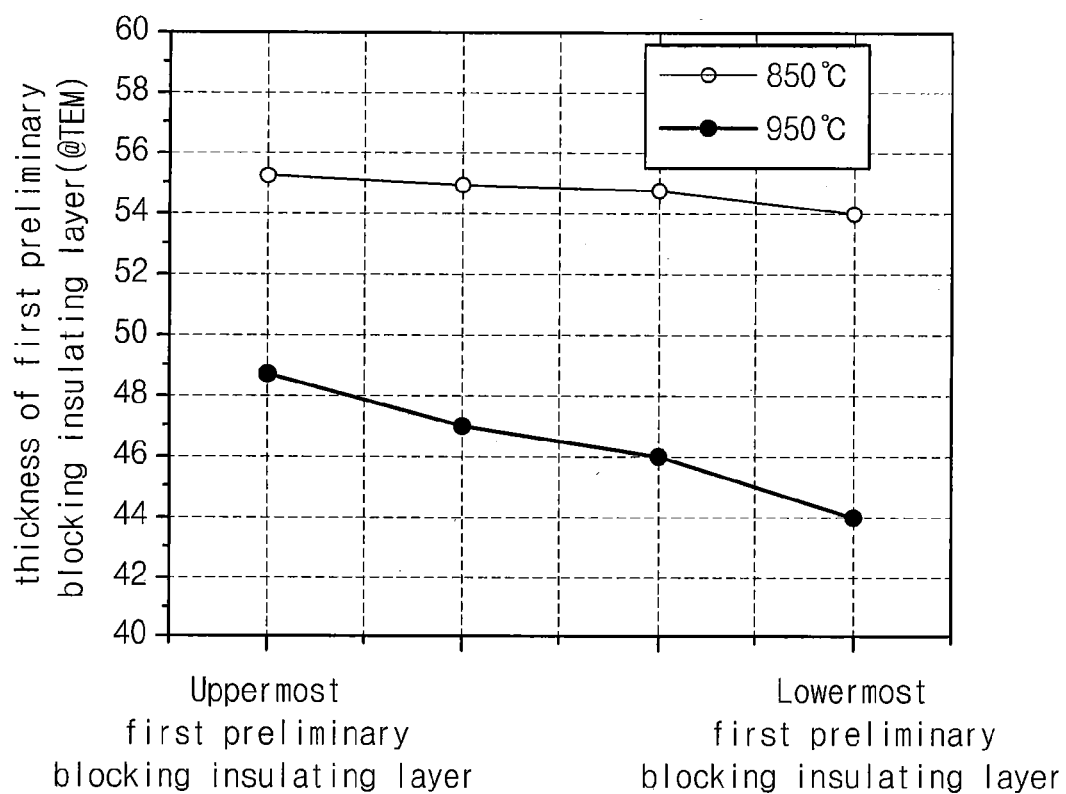
FIG. 8 is a graph showing a relation between thicknesses and vertical positions of first preliminary insulating layers.

Referring to FIGS. 7A and 7B, the vertical holes 116 may be formed, penetrating the layered structure 110 and exposing the substrate 100. In example embodiments, the formation of the vertical holes 116 may include forming a mask pattern (not shown) on the layered structure 110 and performing an anisotropic etching process using the mask pattern as an etch mask. The anisotropic etching process may include over etching (for example, to partially recess the top surface of the substrate 100), and thus, portions of the substrate 100 below the vertical holes 116 may be recessed to a specific depth.

The vertical holes 116 may be two-dimensionally arrayed on the substrate 100, when viewed in a plan view. For example, as shown in FIG. 4, the vertical holes 116 may be arranged in a zigzag arrangement along the first direction D1. But example embodiments of the inventive concept may not be limited thereto.

Thereafter, a first oxidation process may be performed on the resulting structure having the vertical holes 116. In example embodiments, the first oxidation process may be a radical oxidation process. For example, the first oxidation process may be performed at a temperature of 750-950° C. and under a pressure of 5-20 Torr, using a mixture gas of hydrogen (H2) and oxygen (O2) as a source gas. As a result of the first etching process, the sacrificial layers 112 exposed by the vertical holes 116 may be oxidized to form first preliminary blocking insulating regions 121. The first preliminary blocking insulating regions 121 may be, for example, silicon oxide layers.

The first preliminary blocking insulating regions 121 may be locally formed on only a surface of the sacrificial layers 112 exposed by the vertical holes 116. In the case where, as exemplified above, the insulating layers 114 are formed of a silicon oxide layer and the sacrificial layers 112 are formed of a material (e.g., silicon nitride and/or silicon) different from the silicon oxide layer, the first oxidation process may be performed to form the oxide layer on only the exposed surfaces of the sacrificial layers 112. In example embodiments, the first preliminary blocking insulating regions 121 may have inner sidewalls protruding into the vertical holes 116.

In example embodiments, the first preliminary blocking insulating regions 121 may have a thickness tc ranging from 30 Å to 200 Å. In example embodiments, since the first preliminary blocking insulating regions 121 are formed by a radical oxidation process using the afore-described process condition, the first preliminary blocking insulating regions may have a uniform thickness, independent of its vertical position. In other words, it is possible to reduce a difference in thickness between vertically-separated two portions of the first preliminary blocking insulating region 121, which are formed on the sacrificial layers 112 positioned at the highest and lowest levels, respectively, of the layered structure 110. As shown in FIG. 8, in a device in which the first preliminary blocking insulating regions were formed in the afore-described manner, a difference in thickness between the uppermost and lowermost ones of the first preliminary blocking insulating regions was about 1 Å at a temperature of 850° C. or 5 Å at a temperature of 950° C. Given that there is an error in measurement, this shows that the first preliminary blocking insulating regions according to example embodiments of the inventive concept can be formed to have excellent uniformity in thickness.

Viewed in vertical cross-section, the first preliminary blocking insulating regions 121 may include opposite end portions 121e adjacent to the insulating layers 114 and a central portion 121c between the opposite end portions 121e. The opposite end portions 121e of the first preliminary blocking insulating regions 121 may have a rounded shape. Accordingly, the opposite end portions 121e of the first preliminary blocking insulating regions 121 may have a thickness less than that of the central portion 121c. The thickness tc of the first preliminary blocking insulating regions 121 may correspond to the thickness of the central portion 121c of the first preliminary blocking insulating regions 121.

Although not shown, as a result of the first oxidation process, the top surface of the substrate 100 exposed by the vertical holes 116 may be partially oxidized. Such an oxide layer formed on the substrate 100 may be removed using, for example, a cleaning process.

Figure 9A:
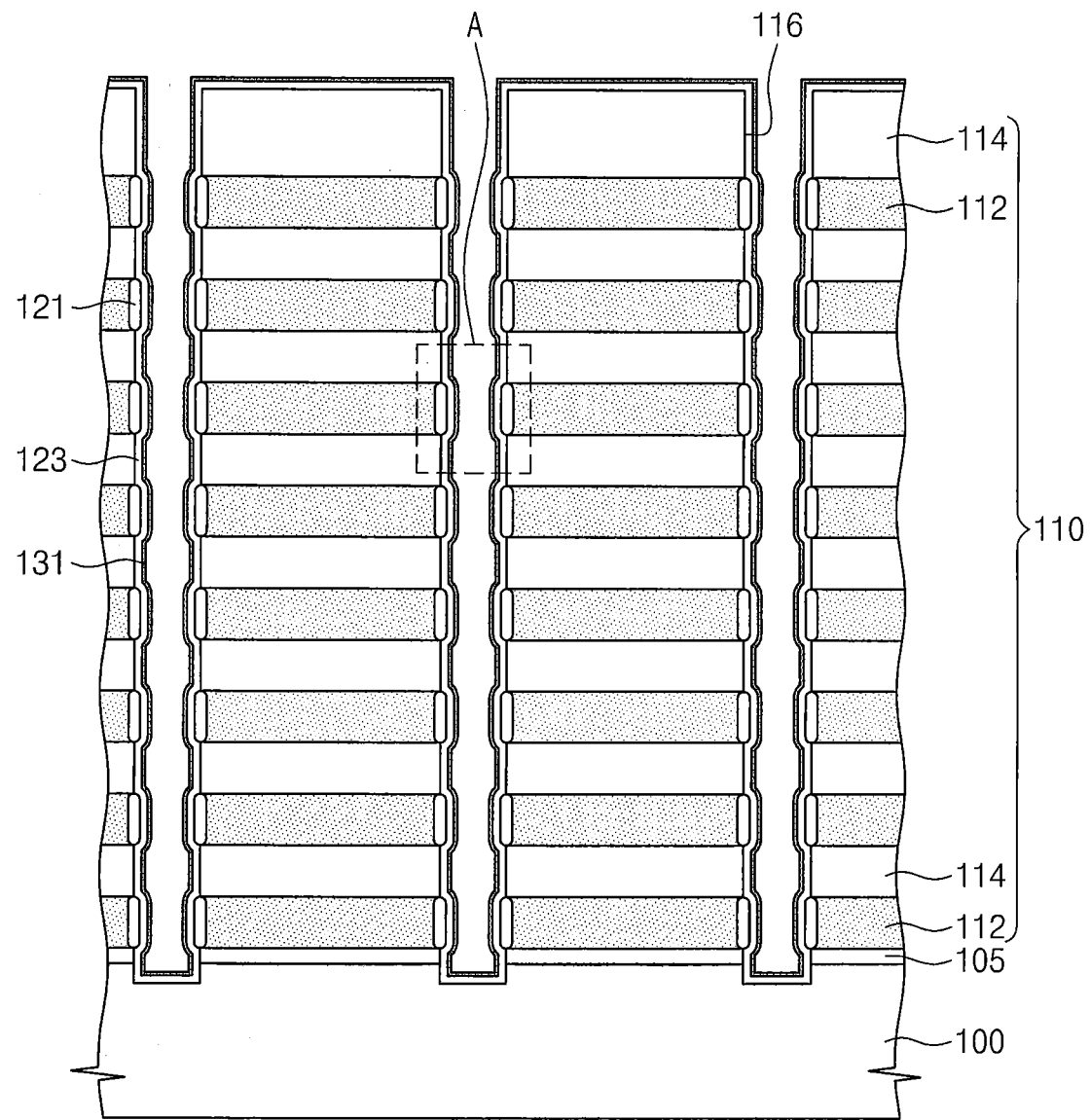
Figure 9B:
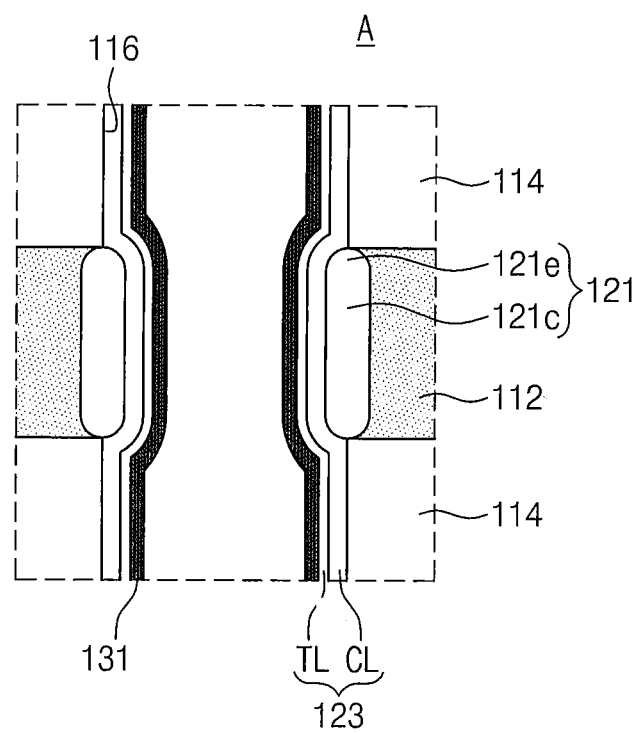

Referring to FIGS. 9A and 9B, a vertical insulating layer 123 and a first semiconductor layer 131 may be sequentially formed in the vertical holes 116 provided with the first preliminary blocking insulating regions 121. In the present embodiment, the vertical insulating layer 123 may include the charge storing layer CL and the tunnel insulating layer TL.

In detail, the charge storing layer CL may conform to the sidewall of the vertical holes 116 provided with the first preliminary blocking insulating regions 121. In other words, the charge storing layer CL may cover sidewalls of the insulating layers 114 and inner sidewalls of the first preliminary blocking insulating regions 121 protruding between the insulating layers 114 and have a substantially uniform thickness. Accordingly, the charge storing layer CL may have a bending or winding profile. In other words, the charge storing layer CL may include at least one portion, which is positioned adjacent to the opposite end portions 121e of the first preliminary blocking insulating regions 121 and has a rounded sidewall. Furthermore, the charge storing layer CL may include a portion, which is positioned adjacent to the central portion 121c of the first preliminary blocking insulating regions 121 and protrudes away from the sacrificial layers 112. In addition, the charge storing layer CL may extend to cover the top surface of the layered structure 110 and the top surface of the substrate 100 exposed by the vertical holes 116. In example embodiments, the charge storing layer CL may be formed by a chemical vapor deposition (CVD) method or an atomic layer deposition (ALD) method. The charge storing layer CL may be a charge trap layer or an insulating layer with conductive nanoparticles. The charge trap layer may be, for example, a silicon nitride layer.

The tunnel insulating layer TL may be conformally formed on the charge storing layer CL. The tunnel insulating layer TL may have substantially the same sectional profile as that of the charge storing layer CL. The tunnel insulating layer TL may be formed of at least one of insulating layers, whose band gaps are greater than that of the charge storing layer CL. For example, the tunnel insulating layer TL may be a silicon oxide layer. In example embodiments, the tunnel insulating layer TL may be formed by a CVD method or an ALD method.

The first semiconductor layer 131 may be conformally formed on the tunnel insulating layer TL. In example embodiments, the first semiconductor layer 131 may be a semiconductor material (e.g., a poly silicon layer, a single crystalline silicon layer, and/or an amorphous silicon layer), which may be formed by a CVD method or an ALD method. Alternatively, the first semiconductor layer 131 may be one of organic semiconductor layers and carbon nanostructures.

A sum of deposition thicknesses of the vertical insulating layer 123 and the first semiconductor layer 131 may be smaller than half a width of each of the vertical holes 116. In other words, the vertical holes 116 may not be completely filled with the vertical insulating layer 123 and the first semiconductor layer 131.

Figure 10A:
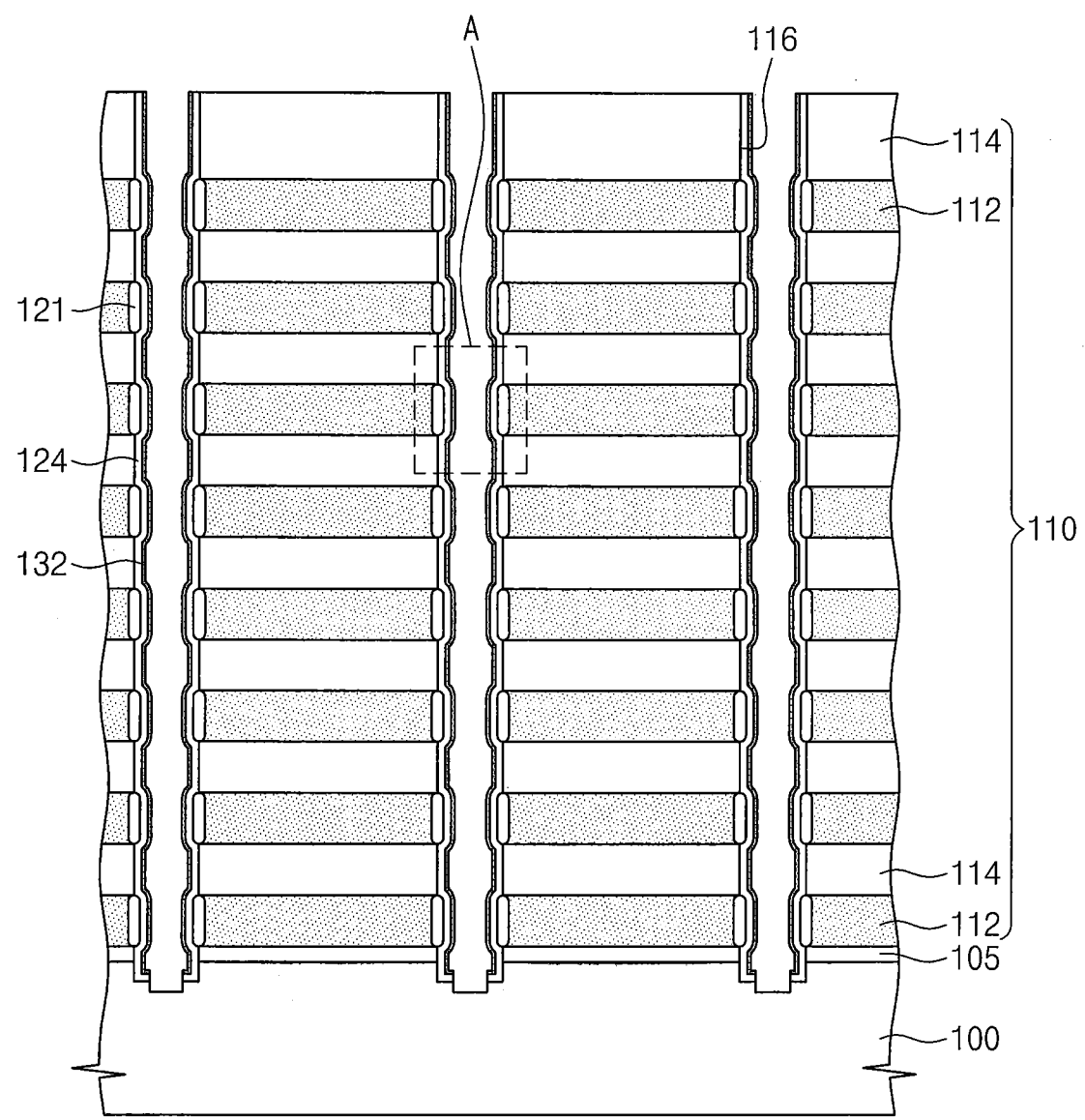
Figure 10B:
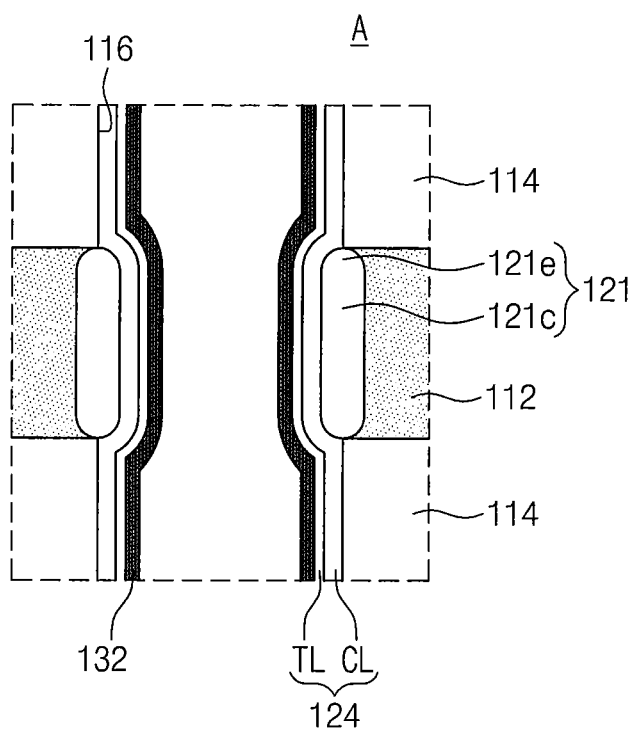

Referring to FIGS. 10A and 10B, the first semiconductor layer 131 and the vertical insulating layer 123 may be removed from bottom surfaces of the vertical holes 116 to expose the top surface of the substrate 100. Accordingly, the first semiconductor pattern 132 and the vertical insulating pattern 124 may be formed on inner side surfaces of the vertical holes 116. In other words, the vertical insulating pattern 124 and the first semiconductor pattern 132 may be shaped like a pipe with open ends. Furthermore, the first semiconductor layer 131 and the vertical insulating layer 123 may be etched in an anisotropic and over-etching manner, and thus, the top surface of the substrate 100 exposed by the first semiconductor pattern 132 may be partially recessed.

A portion of the vertical insulating layer 123 positioned below the first semiconductor pattern 132 may not be etched during the anisotropic etching process, and in this case, the vertical insulating pattern 124 may have a bottom portion interposed between the bottom surface of the first semiconductor pattern 132 and the top surface of the substrate 100.

Furthermore, a top surface of the layered structure 110 may be exposed, as a result of the anisotropic etching on the first semiconductor layer 131 and the vertical insulating layer 123. Accordingly, each of the vertical insulating patterns 124 and the first semiconductor patterns 132 may be locally formed in a corresponding one of the vertical holes 116.

Figure 11A:
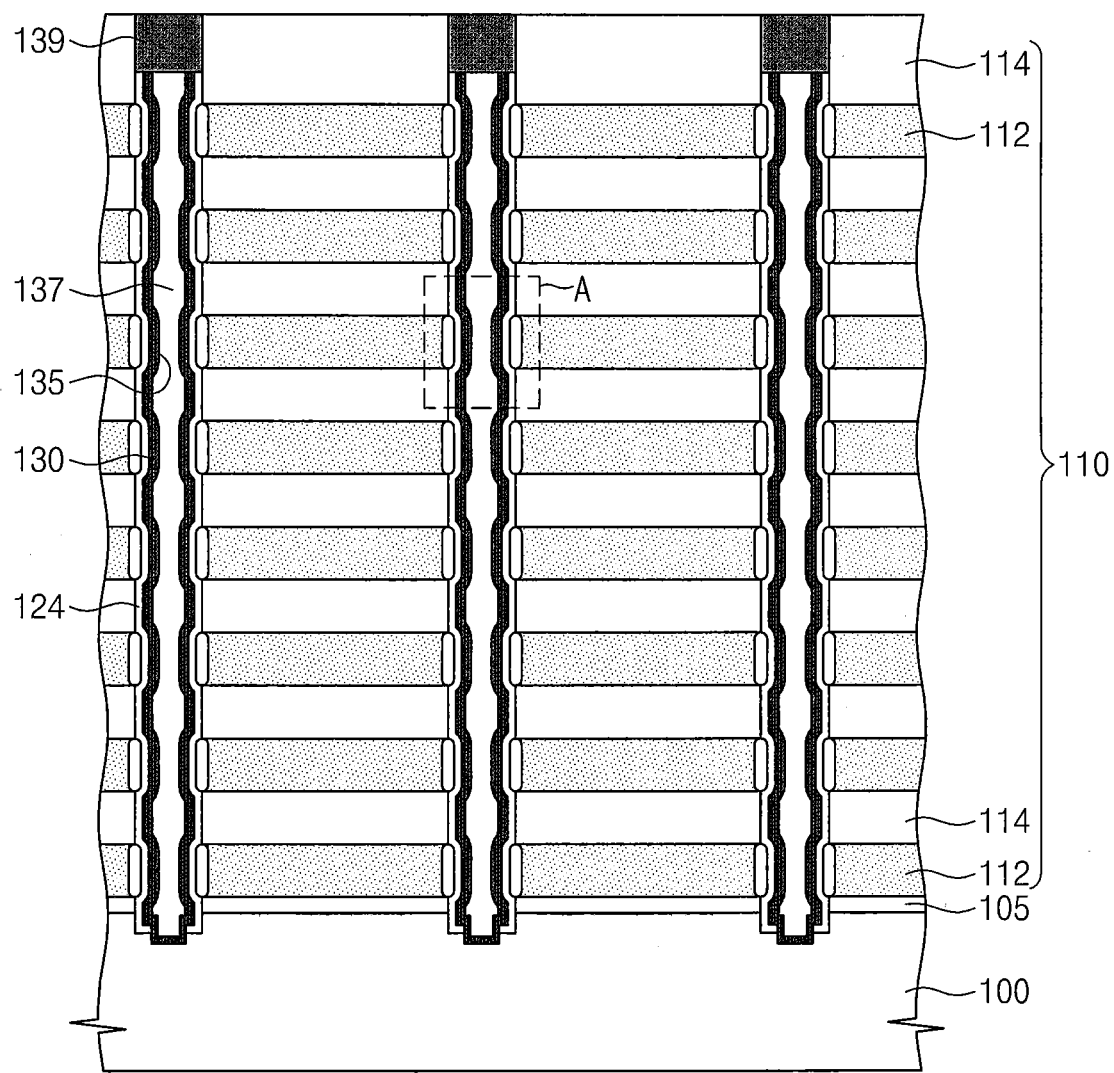
Figure 11B:
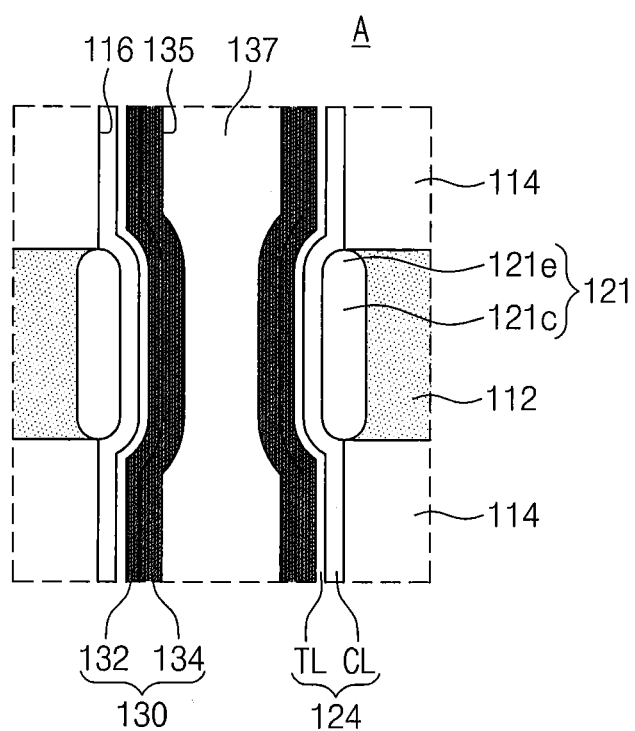

Referring to FIGS. 11A and 11B, the second semiconductor pattern 134 and the insulating gap-filling pattern 137 may be sequentially formed in the vertical holes 116 provided with the vertical insulating pattern 124 and the first semiconductor pattern 132.

In example embodiments, the second semiconductor pattern 134 and the insulating gap-filling pattern 137 may be formed by sequentially forming a second semiconductor layer and an insulating gap-filling layer in the vertical holes 116 provided with the vertical insulating pattern 124 and the first semiconductor pattern 132 and planarizing them to expose the top surface of the layered structure 110.

The second semiconductor layer may be formed of a semiconductor material (e.g., poly silicon, single crystalline silicon, and/or amorphous silicon), which may be formed using one of atomic layer deposition (ALD) and chemical vapor deposition (CVD) techniques. In example embodiments, the second semiconductor layer may be conformally formed not to completely fill the vertical holes 116. The inner side surface of the second semiconductor layer may define the internal space 135. In other example embodiments, unlike that illustrated in the drawings, the second semiconductor pattern 134 may completely fill the vertical holes 116. The first and second semiconductor patterns 132 and 134 may constitute the active pillar 130.

The insulating gap-filling pattern 137 may fill the internal space 135 of the active pillar 130. The insulating gap-filling pattern 137 may be formed by a spin-on-glass (SOG) process and may be one of insulating materials and a silicon oxide layer.

Thereafter, the conductive pad 139 may be connected to the first and second semiconductor patterns 132 and 134. In example embodiments, the conductive pad 139 may be formed by recessing top portions of the first and second semiconductor patterns 132 and 134 and filling the recessed portions with a conductive material. Alternatively, the formation of the conductive pad 139 may include doping the first and second semiconductor patterns 132 and 134 thereunder with impurities to have a conductivity type different therefrom. In this case, the conductive pad 139 may constitute a diode in conjunction with portions of the first and second semiconductor patterns 132 and 134 thereunder.

Figure 12A:
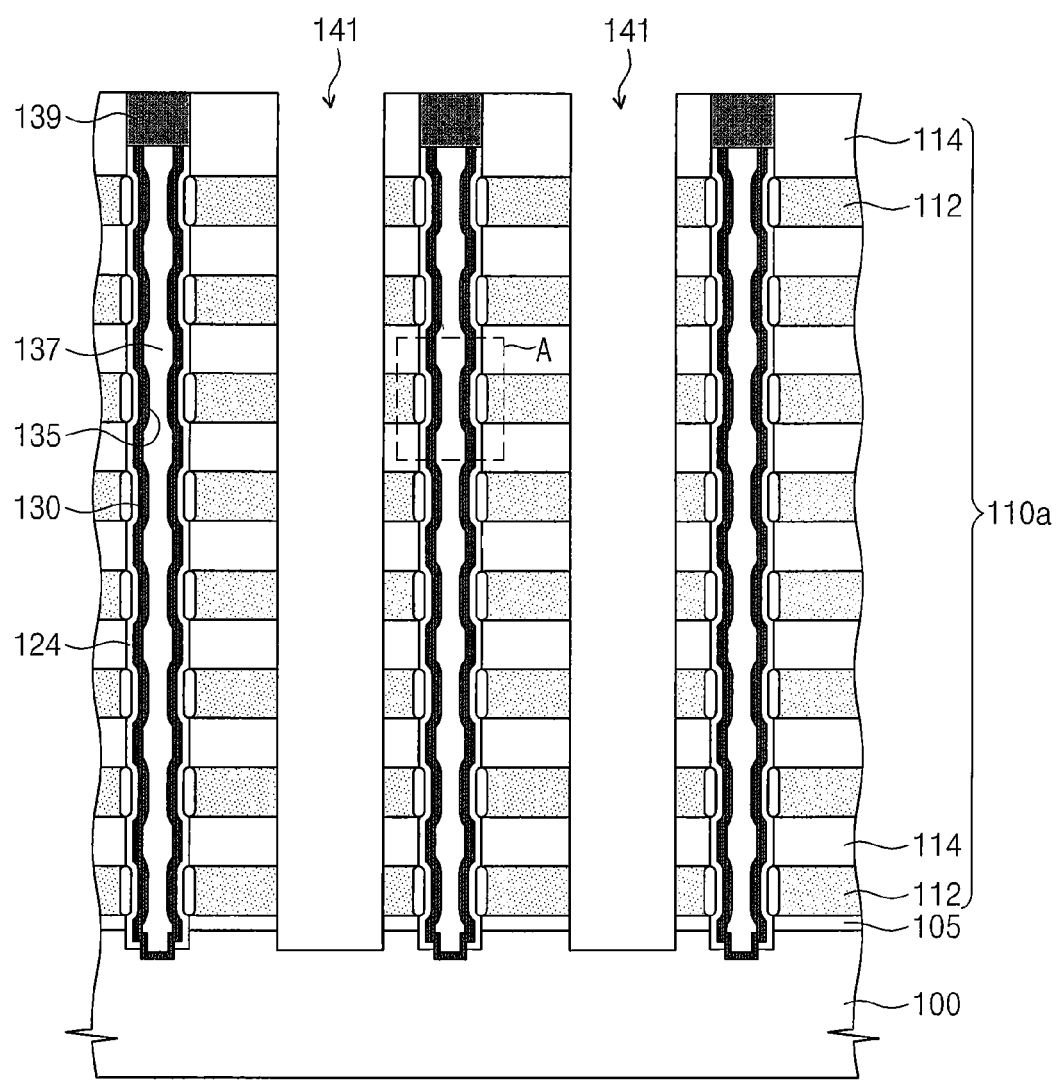
Figure 12B:
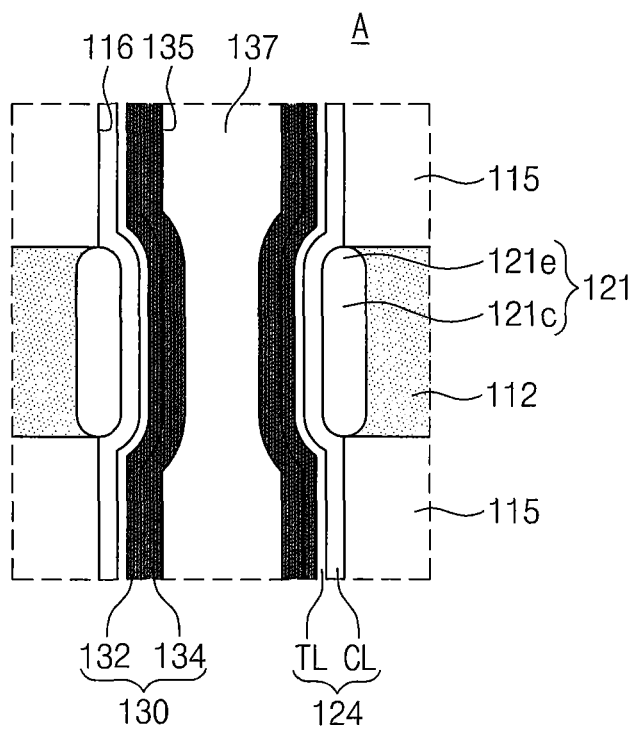

Referring to FIGS. 12A and 12B, the layered structure 110 may be patterned to form the isolation trench 141 exposing the substrate 100.

In example embodiments, the patterning of the layered structure 110 may include forming a mask pattern (not shown) on the layered structure 110 and sequentially etching the lower insulating layer 105, the sacrificial layers 112, and the insulating layers 114 using as an etch mask. As shown in FIG. 4, the isolation trench 141 may be shaped like a line or rectangle extending parallel to the first direction D1. The formation of the isolation trench 141 may be performed in an over-etch manner, and thus, the top surface of the substrate 100 exposed by the isolation trench 141 may be recessed to a specific depth.

As a result of the formation of the isolation trench 141, preliminary stacks 110a may include patterned structures of the sacrificial layers 112 and the insulating layers 114. The insulating patterns 115 may refer to the patterned structures of the insulating layers 114. The preliminary stacks 110a may have a line shape extending parallel to the isolation trench 141 or the first direction D1, when viewed in a plan view. The isolation trench 141 may expose sidewalls of the insulating patterns 115 and the patterned structures of the sacrificial layers 112.

Figure 13A:
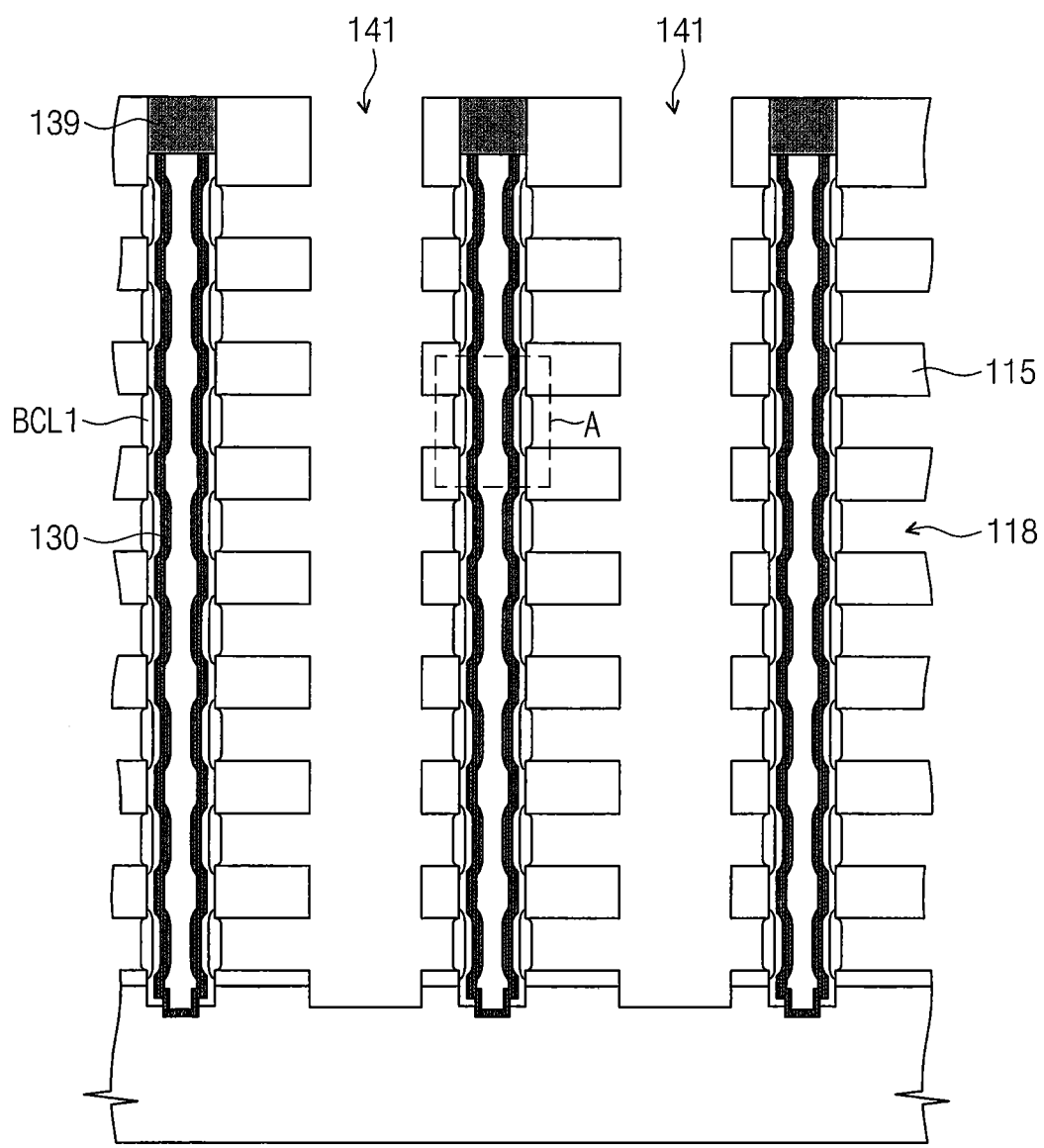
Figure 13B:
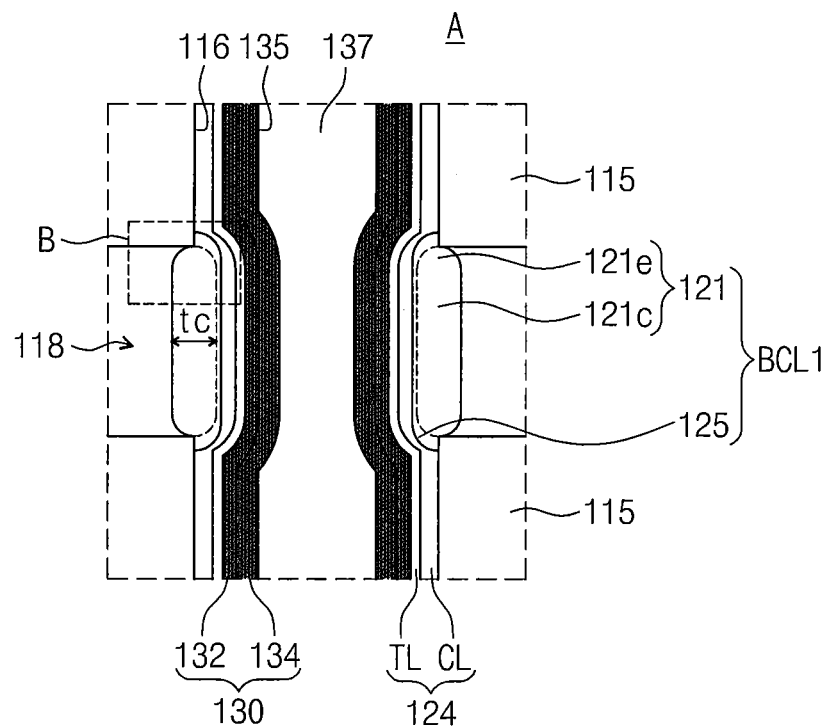
Figure 13C:
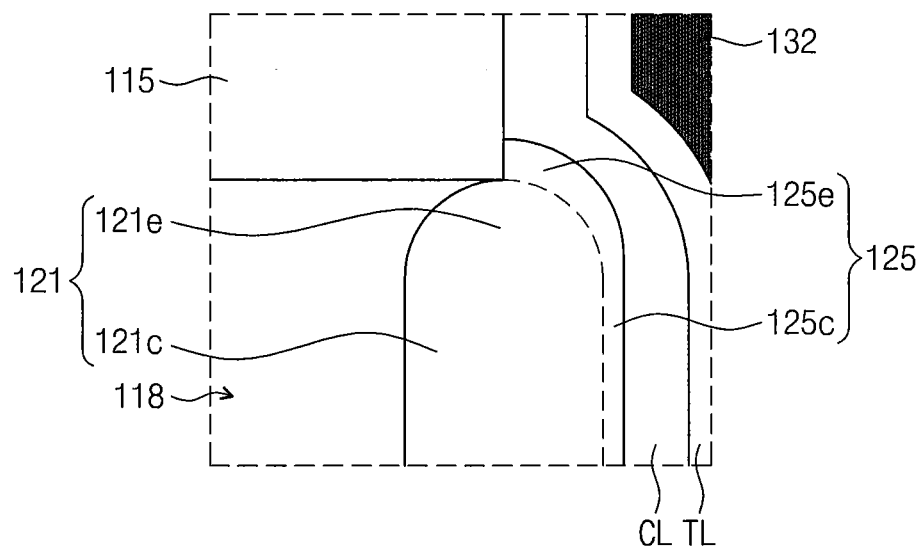
FIGS. 13C and 13D are enlarged views illustrating a portion "B" of FIG. 13B.
Figure 13D:
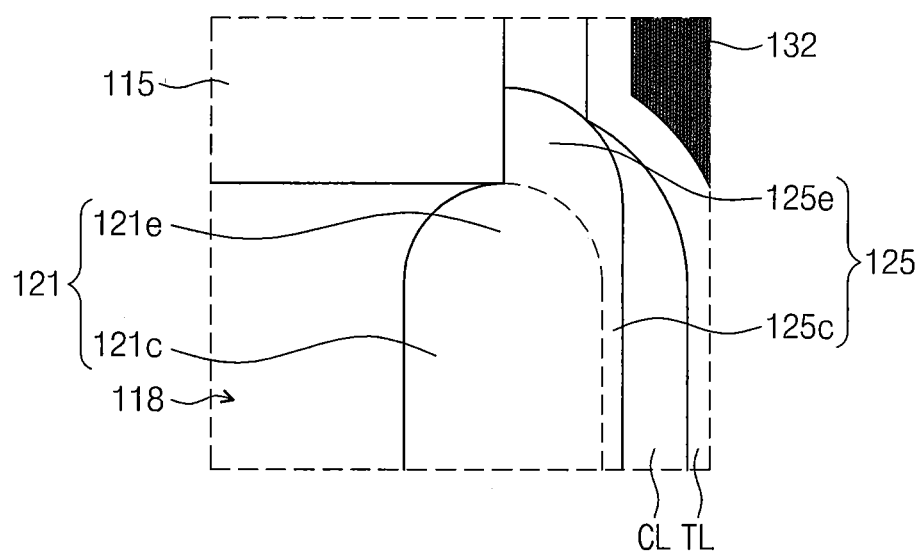

Referring to FIGS. 13A and 13B, the sacrificial layers 112 exposed by the isolation trench 141 may be removed to form recesses 118 between the insulating patterns 115.

The recesses 118 may be formed by selectively removing the sacrificial layers 112 between the insulating patterns 115. The recesses 118 may extend horizontally from the isolation trench 141 in between the insulating patterns 115 and expose the outer sidewall of the first preliminary blocking insulating regions 121. In other words, each of the recesses 118 may be defined by a vertically adjacent pair of the insulating patterns 115 and the outer sidewall of the first preliminary blocking insulating regions 121. In example embodiments, in the case where the sacrificial layers 112 includes a silicon nitride layer, the removal of the sacrificial layers 112 may be performed using etching solution containing phosphoric acid.

A second oxidation process may be performed on the resulting structure with the recesses 118. The second oxidation process may be performed in substantially the same manner as the first oxidation process. In other words, the second oxidation process may be a radical oxidation process using mixture gas of hydrogen (H2) and oxygen (O2). The second oxidation process may be performed at a temperature of 750-950° C. and under a pressure of 5-20 Torr. As a result of the second oxidation process, portions of the charge storing layer CL in contact with the first preliminary blocking insulating regions 121 may be oxidized to form second preliminary blocking insulating regions 125. The second preliminary blocking insulating regions 125 may include, for example, a silicon oxide layer. As an example, oxygen radical, which are produced during the second oxidation process, may pass through the first preliminary blocking insulating regions 121 and then may be chemically reacted with silicon atoms of the charge storing layer CL to form the second preliminary blocking insulating regions 125.

According to example embodiments of the inventive concept, the opposite end portions 121e of the first preliminary blocking insulating regions 121 may be formed thinner than the central portion 121c thereof. Accordingly, the oxygen radical produced during the second oxidation process may be more easily infiltrated into the charge storing layer CL through a path including the opposite end portions 121e of the first preliminary blocking insulating regions 121, compared with another path including the central portion 121c. As a result, the second preliminary blocking insulating region 125 may be thicker adjacent to the opposite end portions 121e of the first preliminary blocking insulating regions 121 than on another region adjacent to the central portion 121c, as shown in FIG. 13C. In other words, opposite end portions 125e of the second preliminary blocking insulating regions 125, which is positioned adjacent to the opposite end portions 121e of the first preliminary blocking insulating regions 121, may be formed thicker than a central portion 125c of the second preliminary blocking insulating regions 125, which is positioned adjacent to the central portion 121c of the first preliminary blocking insulating regions 121. As a result, portions of the charge storing layer CL, which are positioned adjacent to the opposite end portions 125e of the second preliminary blocking insulating regions 125, may have a smaller thickness than other portion of the charge storing layer CL, which is positioned adjacent to the central portion 125c of the second preliminary blocking insulating regions 125. In other words, the charge storing layer CL may include at least one portion, which is positioned adjacent to the opposite end portions 125e of the second preliminary blocking insulating regions 125 and has a reduced thickness.

Although not illustrated, a thickness of the central portion 125c of the second preliminary blocking insulating region 125 may be substantially zero. In other words, the second preliminary blocking insulating region 125 may have only the opposite end portions 125e. This may be because an amount of oxygen radical penetrating the central portion 121c of the first preliminary blocking insulating regions 121 is too small to cause an oxidation reaction in a region between the central portion 121c of the first preliminary blocking insulating regions 121 and the charge storing layer CL. The second preliminary blocking insulating regions 125 may be formed by controlling the thickness of the first preliminary blocking insulating region 121 (for example, by forming the first preliminary blocking insulating regions 121 in such a way that the central portion 121c has a thickness relatively greater than the opposite end portions 121e) and/or by controlling a process condition in the second oxidation process (for example, by reducing a process time in the second oxidation process). In this case, except for the portion adjacent to the opposite end portions 125e of the second preliminary blocking insulating regions 125, the charge storing layer CL may have substantially a uniform thickness.

In other example embodiments, as shown in FIG. 13D, the second preliminary blocking insulating regions 125 may be formed in such a way that the opposite end portions 125e penetrate the charge storing layer CL to be in contact with the tunnel insulating layer TL. Such a structure of the second preliminary blocking insulating regions 125 may be achieved by controlling the thickness of the first preliminary blocking insulating region 121 and/or the process condition in the second oxidation process.

The first and second preliminary blocking insulating regions 121 and 125 may serve as the first blocking insulating region BCL1. The first portion P1 of the first blocking insulating region BCL1 described with reference to FIGS. 5A through 5D may include a portion of the first preliminary blocking insulating region 121. The second portion P2 of the first blocking insulating region BCL1 may include other portion of the first preliminary blocking insulating region 121 and the second preliminary blocking insulating region 125. The overlapping portions P2a of the first blocking insulating region BCL1 described with reference to FIGS. 5A through 5D may include the opposite end portions 125e of the second preliminary blocking insulating region 125.

Although not shown, as a result of the second oxidation process, the top surface of the substrate 100 exposed by the isolation trench 141 may be partially oxidized. Such an oxide layer formed on the substrate 100 may be removed by a subsequent process (e.g., a cleaning process).

Figure 14A:
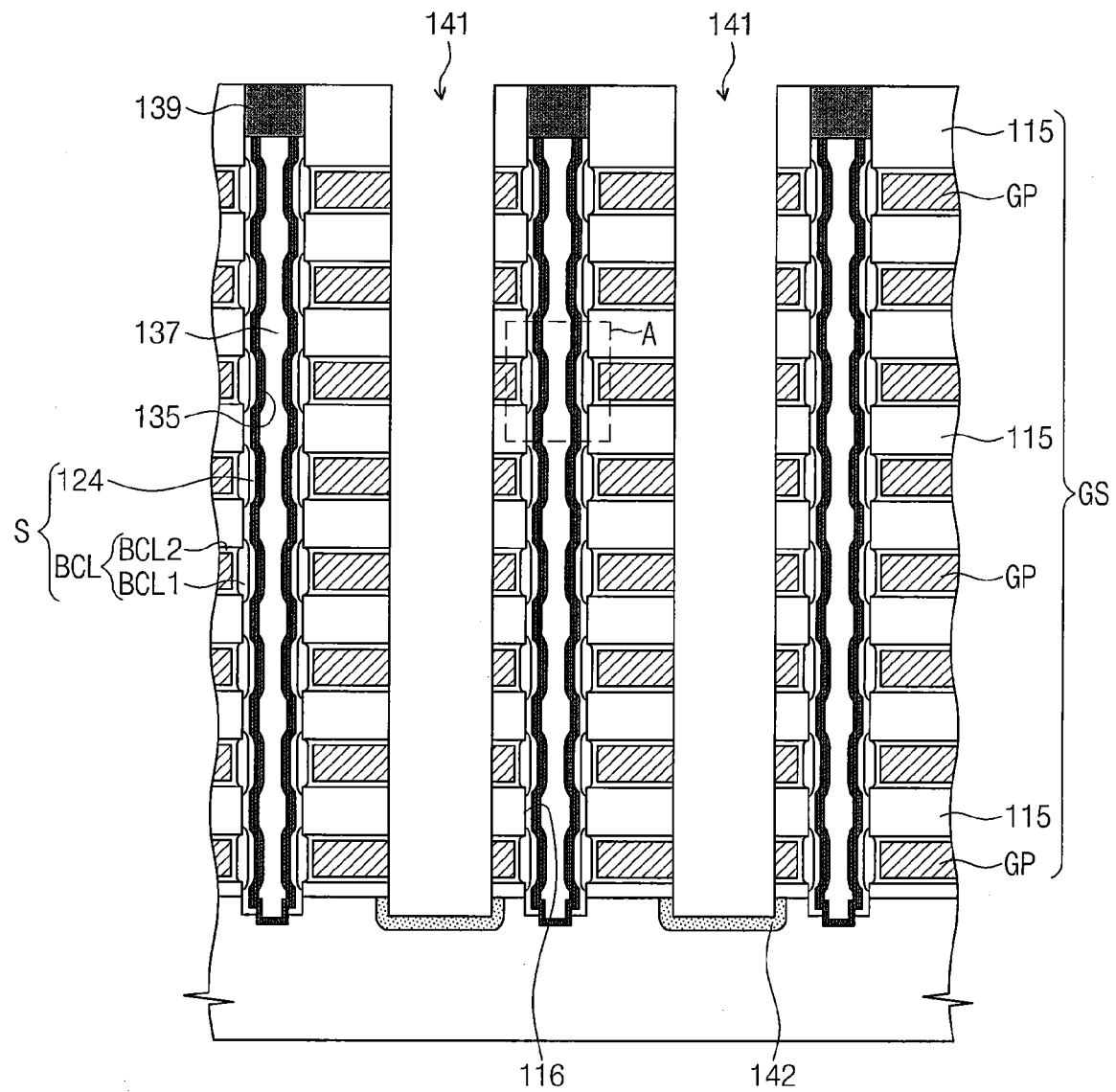
Figure 14B:
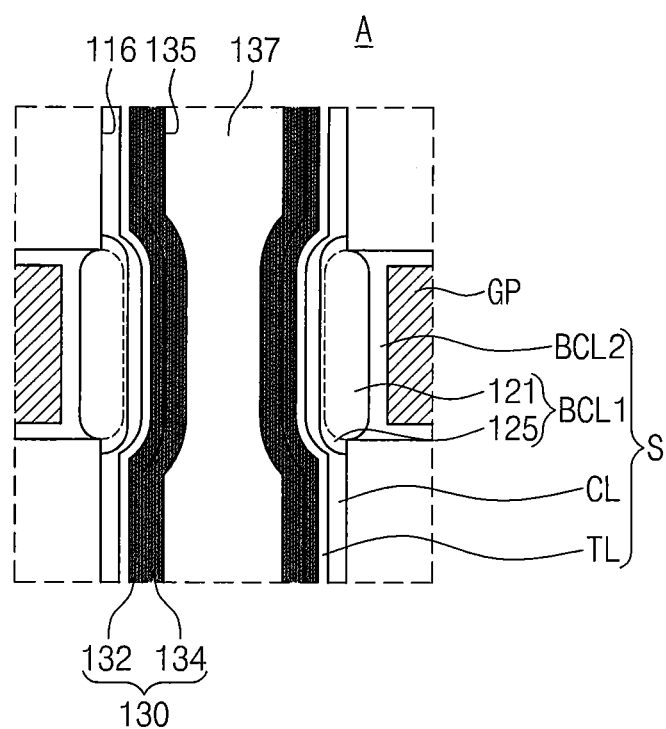

Referring to FIGS. 14A and 14B, the second blocking insulating region BCL2 may be formed on the insulating patterns 115 and the first blocking insulating region BCL1 exposed by the recess 118. In the present embodiments, the second blocking insulating region BCL2 may include a material having a dielectric constant higher than that of a silicon oxide layer. For example, the second blocking insulating regions BCL2 may include an aluminum oxide layer and/or a hafnium oxide layer. The second blocking insulating region BCL2 may be formed by an ALD process. The first and second blocking insulating regions BCL1 and BCL2 may serve as the blocking insulating region BCL. Furthermore, the blocking insulating region BCL, the charge storing layer CL, and the tunnel insulating layer TL may serve as the data storing element S or the memory layer.

Thereafter, by supplying a conductive material through the isolation trench 141, a conductive layer (not shown) may be formed in the recesses 118. The conductive layer may include at least one of, for example, a doped poly-silicon layer, a metal layer (e.g., of tungsten), and a metal nitride layer. For example, the conductive layer may include a metal nitride layer and a metal layer thereon. The conductive layer may be formed by an ALD process.

The conductive layer may be removed (i.e., the isolation trench 141) outside of the recesses 118. Accordingly, respective ones of the gate patterns GP may be formed in the recesses 118. Furthermore, as a result of the removal of the conductive layer from the isolation trench 141, the substrate 100 may be exposed through the isolation trench 141. The common source regions 142 may be formed by highly doping the exposed portions of the substrate 100 with impurity ions having the second conductivity type.

Referring back to FIG. 4A and FIGS. 5A through 5D, the insulating spacer 143 may be formed on a sidewall of the isolation trench 141. The insulating spacer 143 may be formed by depositing and anisotropically etching a silicon oxide layer or a silicon nitride layer.

The device isolation pattern 145 may fill the isolation trench 141. The device isolation pattern 145 may extend along the isolation trench 141 or parallel to the first direction D1. The device isolation pattern 145 may include a silicon oxide layer. The device isolation pattern 145 may have a top surface coplanar with that of the uppermost one of the insulating patterns 115.

The strapping plugs 140 may be formed in the device isolation pattern 145. Furthermore, the barrier layer 148 may be formed between the device isolation pattern 145 and the strapping plugs 140. The strapping plugs 140 may include a metallic (e.g., tungsten, copper, and/or aluminum) layer. The barrier layer 148 may include a conductive metal nitride (e.g., titanium nitride and/or tantalum nitride) layer. The strapping plugs 140 may be electrically connected to the common source regions 142 via common contacting layers (not shown).

The first contacts 162 may be connected to the strapping plugs 140. The strapping lines 160 may be formed on and connected to the first contacts 162. The strapping lines 160 may extend in parallel along the first direction D1. The strapping lines 160 may be electrically connected to the strapping plugs 140 through the first contacts 162. The strapping lines 160 and the first contacts 162 may include at least one selected of metals (e.g., tungsten, copper, and/or aluminum), conductive metal nitrides (e.g., titanium nitride and/or tantalum nitride), and transition metals (e.g., titanium and/or tantalum).

The second contacts 164 may be formed on and connected to the active pillars 130. The bit lines BL may be formed on the second contacts 164 to connect the second contacts 164 to each other. The bit lines BL may extend in the second direction D2. The bit lines BL may be electrically connected to the active pillars 130 through second contacts 164. The bit lines BL and the second contacts 164 may include at least one of metals (e.g., tungsten, copper and/or aluminum), conductive metal nitrides (e.g., titanium nitride and/or tantalum nitride), and transition metals (e.g., titanium and/or tantalum).

The third contacts 166 may be formed on and connected to the strapping line 160. The common source line CSL may be formed on the third contacts 166 to connect the third contacts 166 to each other. Accordingly, the common source line CSL may be electrically connected to the strapping line 160 through third contacts 166. The common source line CSL and the third contacts 166 may include at least one of metals (e.g., tungsten, copper, and aluminum), conductive metal nitrides (e.g., titanium nitride and/or tantalum nitride), and transition metals (e.g., titanium and/or tantalum).

Figure 15A:
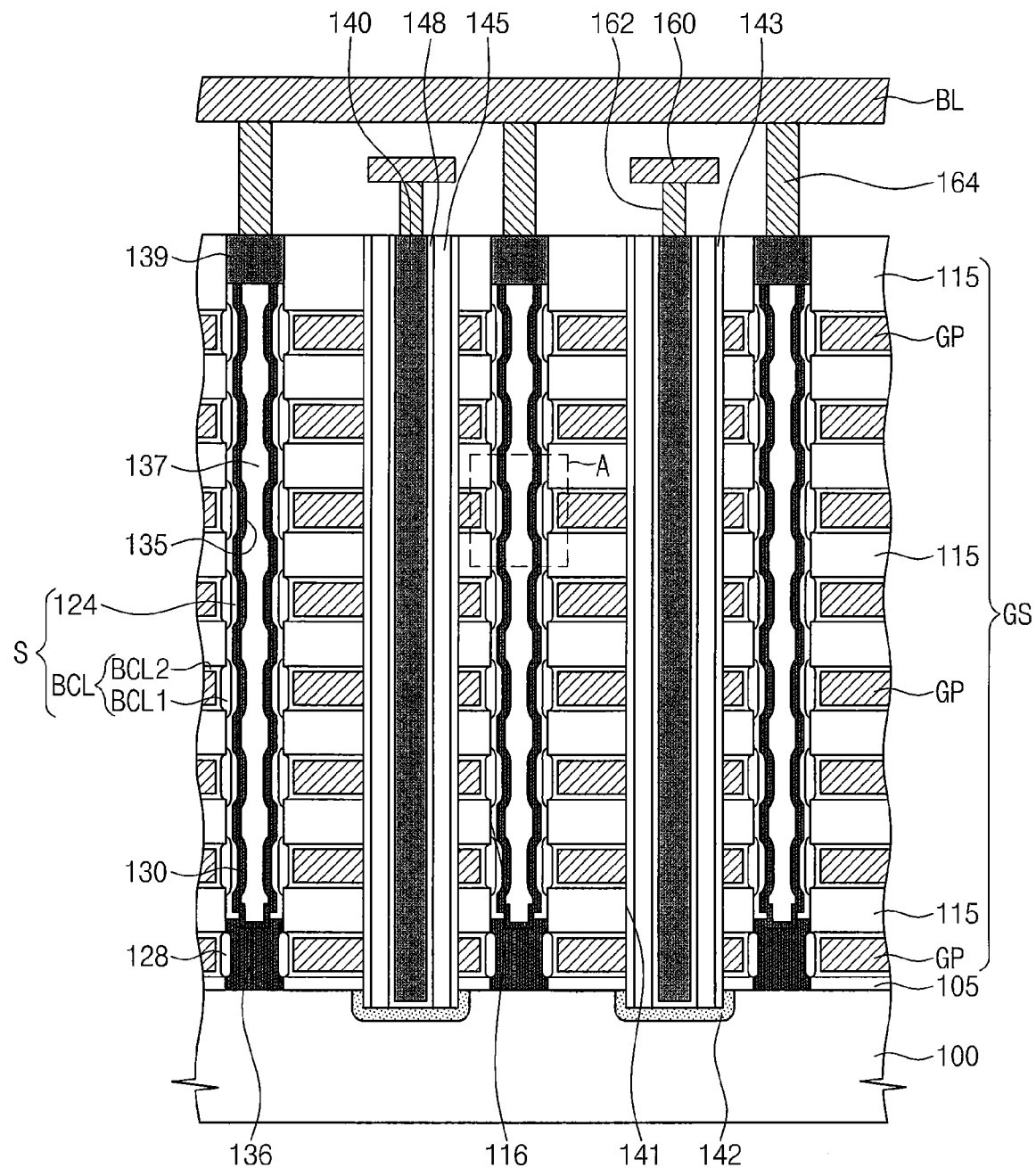
FIG. 15A is a sectional view taken along line I-I' of FIG. 4 to illustrate a semiconductor device according to other example embodiments of the inventive concepts.
Figure 15B:
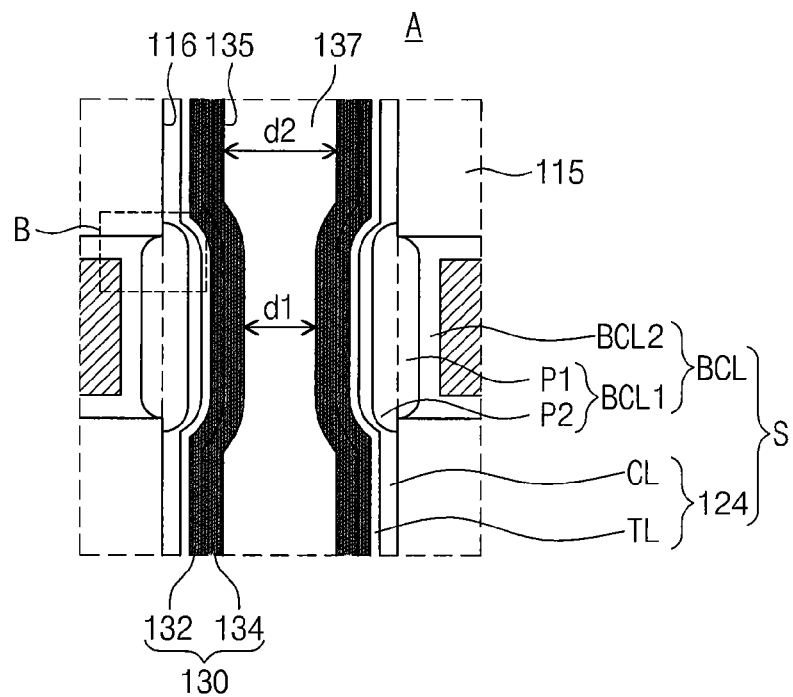
FIG. 15B is an enlarged view illustrating a portion "A" of FIG. 15A, and FIGS. 15C and 15D are enlarged views illustrating a portion "B" of FIG. 15B.
Figure 15C:
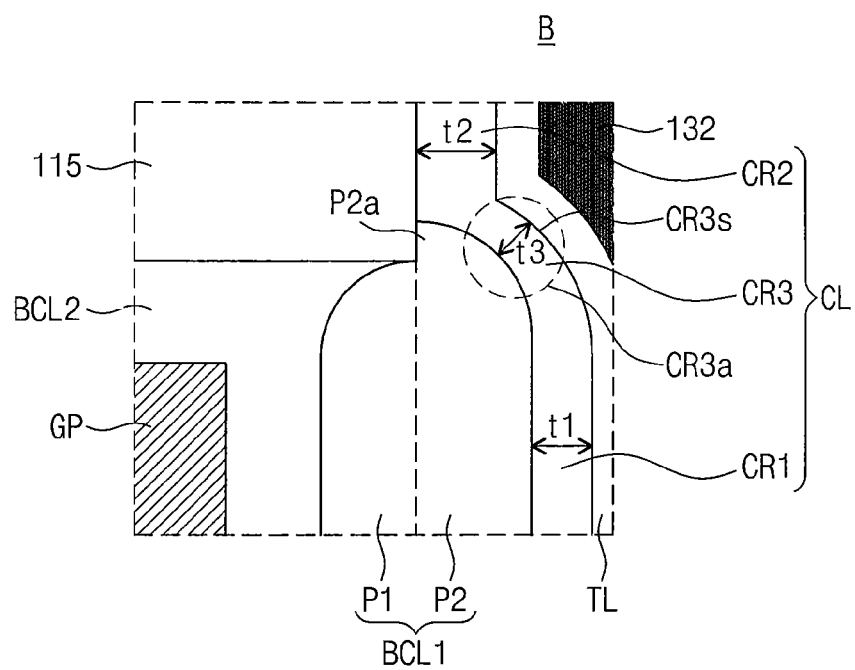
Figure 15D:
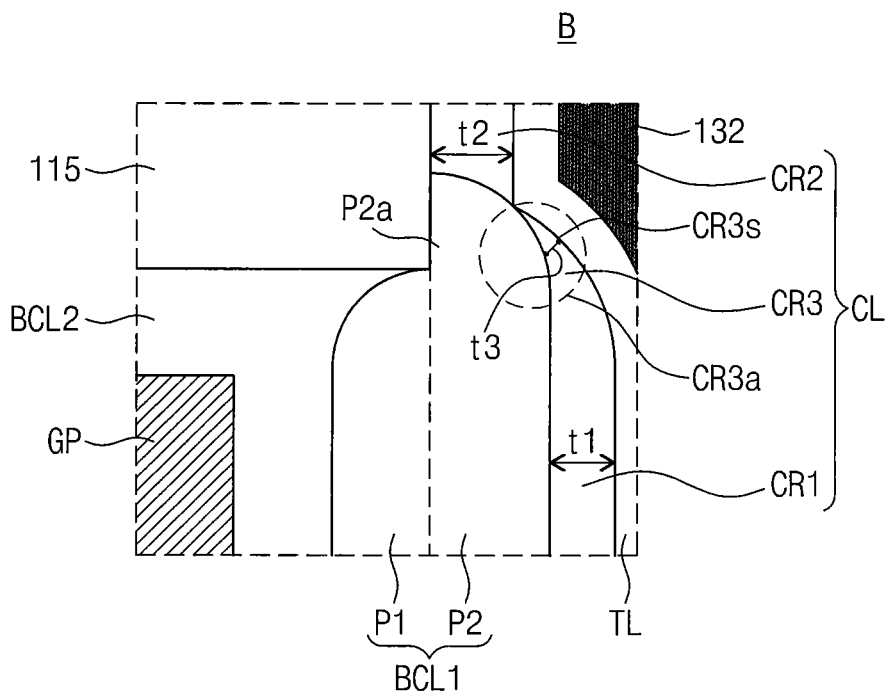

FIG. 15A is a sectional view taken along line I-I' of FIG. 4 to illustrate a semiconductor device according to other example embodiments of the inventive concept. FIG. 15B is an enlarged view illustrating a portion "A" of FIG. 15A, and FIGS. 15C and 15D are enlarged views illustrating a portion "B" of FIG. 15B. In the following description, a previously-described element may be identified by a similar or identical reference number without repeating an overlapping description thereof, for the sake of brevity.

Referring to FIG. 4 and FIGS. 15A through 15D, a semiconductor device may further include a lower semiconductor pattern 136, which penetrates a lower portion of the stack GS and is connected to the substrate 100. The lower semiconductor pattern 136 may have a bottom surface positioned below the top surface of the substrate 100 or have a bottom portion inserted into the substrate 100. Furthermore, the lower semiconductor pattern 136 may have a top surface positioned higher level than that of a top surface of the lowermost one of the gate patterns GP.

The insulating pattern 115 adjacent to the lower semiconductor pattern 136 may be in direct contact with a portion of a sidewall of the lower semiconductor pattern 136. The second blocking insulating region BCL2 may be interposed between the lowermost one of the gate patterns GP and the lower semiconductor pattern 136. A gate dielectric layer 128 may be interposed between the second blocking insulating region BCL2 and the lower semiconductor pattern 136. The gate dielectric layer 128 may include, for example, a silicon oxide layer.

The lower semiconductor pattern 136 may be formed of a semiconductor material having the same conductivity type as the substrate 100. In example embodiments, the lower semiconductor pattern 136 may be formed by a selective epitaxial growth (SEG) process in which the substrate 100 exposed by the vertical hole 116 is used as a seed layer. The lower semiconductor pattern 136 may be a pillar filling a lower portion of the vertical hole 116. In example embodiments, the lower semiconductor pattern 136 may be formed after the formation of the first preliminary blocking insulating regions 121 (e.g., of FIGS. 7A and 7B). In this case, an oxide layer, which is formed on a surface of the lowermost one of the sacrificial layers 112, may serve as the gate dielectric layer 128. In other example embodiments, the lower semiconductor pattern 136 may be formed before the formation of the first preliminary blocking insulating regions 121 (e.g., of FIGS. 7A and 7B).

The active pillar 130 may be formed on the lower semiconductor pattern 136. The active pillar 130 may be electrically connected to the substrate 100 through the lower semiconductor pattern 136. The active pillar 130 may have a bottom surface positioned at a lower level than that of the top surface of the lower semiconductor pattern 136 or have a bottom portion inserted into the lower semiconductor pattern 136.

Except for these differences, the semiconductor device may be configured to have substantially the same features (e.g., associated with the insulating gap-filling pattern 137 and the data storing element S) as those of the previous embodiments, and moreover, it may be fabricated by a method similar to that of the previous embodiments.

Figure 16:
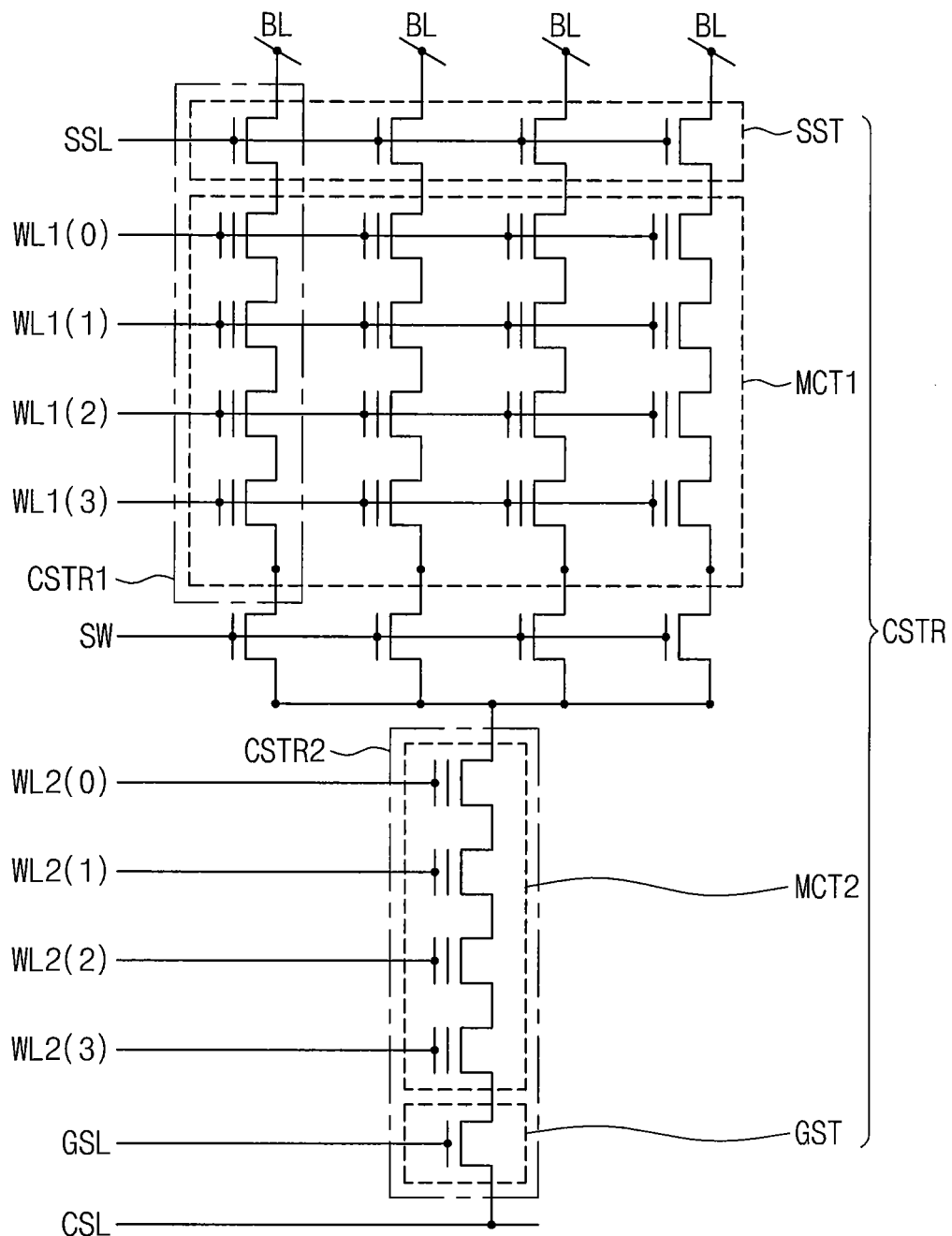
FIG. 16 is a circuit diagram schematically illustrating the cell array of the memory block of FIG. 2, according to other example embodiments of the inventive concepts.

FIG. 16 is a circuit diagram schematically illustrating the cell array of the memory block of FIG. 2, according to other example embodiments of the inventive concept.

Referring to FIG. 16, a cell array of a semiconductor device according to the present embodiments may include a common source line CSL, a plurality of bit lines BL, and a cell string CSTR between the common source line CSL and the bit lines BL.

The common source line CSL may be a conductive layer provided on a substrate, and the bit lines BL may be conductive patterns (e.g., metal lines) disposed on the substrate.

The cell string CSTR may include a plurality of upper strings CSTR1, which are respectively connected to the bit lines BL, and a single lower string CSTR2, which is connected to the common source line CSL. The plurality of upper strings CSTR1 may be connected in common to the single lower string CSTR2. The upper strings CSTR1 may be connected in common to the lower string CSTR2 through at least one switching device SW. The at least one switching device SW connected to the upper strings CSTR1 may be configured in such a way that the same voltage is applied thereto.

Each of the upper strings CSTR1 may include a string selection transistor SST connected to a corresponding one of the bit lines BL and a plurality of upper memory cell transistors MCT1 disposed between the string selection transistor SST and the switching device SW. The string selection transistor SST may be connected in series to the upper memory cell transistors MCT1. The lower string CSTR2 may include the ground selection transistor GST coupled to the common source line CSL and a plurality of lower memory cell transistors MCT2 disposed between the ground selection transistor GST and the switching devices SW. The ground selection transistor GST may be connected in series to the lower memory cell transistors MCT2.

The string selection line SSL and upper word lines WL1(0)-WL1(3), which are disposed between the bit lines BL and the switching devices SW, may be respectively used for gate electrodes of the string selection transistor SST and the upper memory cell transistors MCT1. The ground selection line GSL and lower word lines WL2(0)-WL2(3), which are disposed between the common source line CSL and the switching devices SW, may be respectively used for gate electrodes of the ground selection transistor GST and the lower memory cell transistors MCT2. Each of the upper and lower memory cell transistors MCT1 and MCT2 may include a data storing element or a memory layer.

The plurality of upper strings CSTR1 connected to respective bit lines may be connected in common to a single lower string CSTR2 connected to a common source line. Thus, the ground selection transistor GST of the single lower string CSTR2 may be shared by the upper strings CSTR1 including the string selection transistors SST, which are respectively coupled to the bit lines BL. Since the ground selection transistor GST of the single lower string CSTR2 is shared by the upper strings CSTR1, which are connected to respective bit lines and are independently operated, it possible to increase an integration density of the semiconductor device.

Figure 17A:
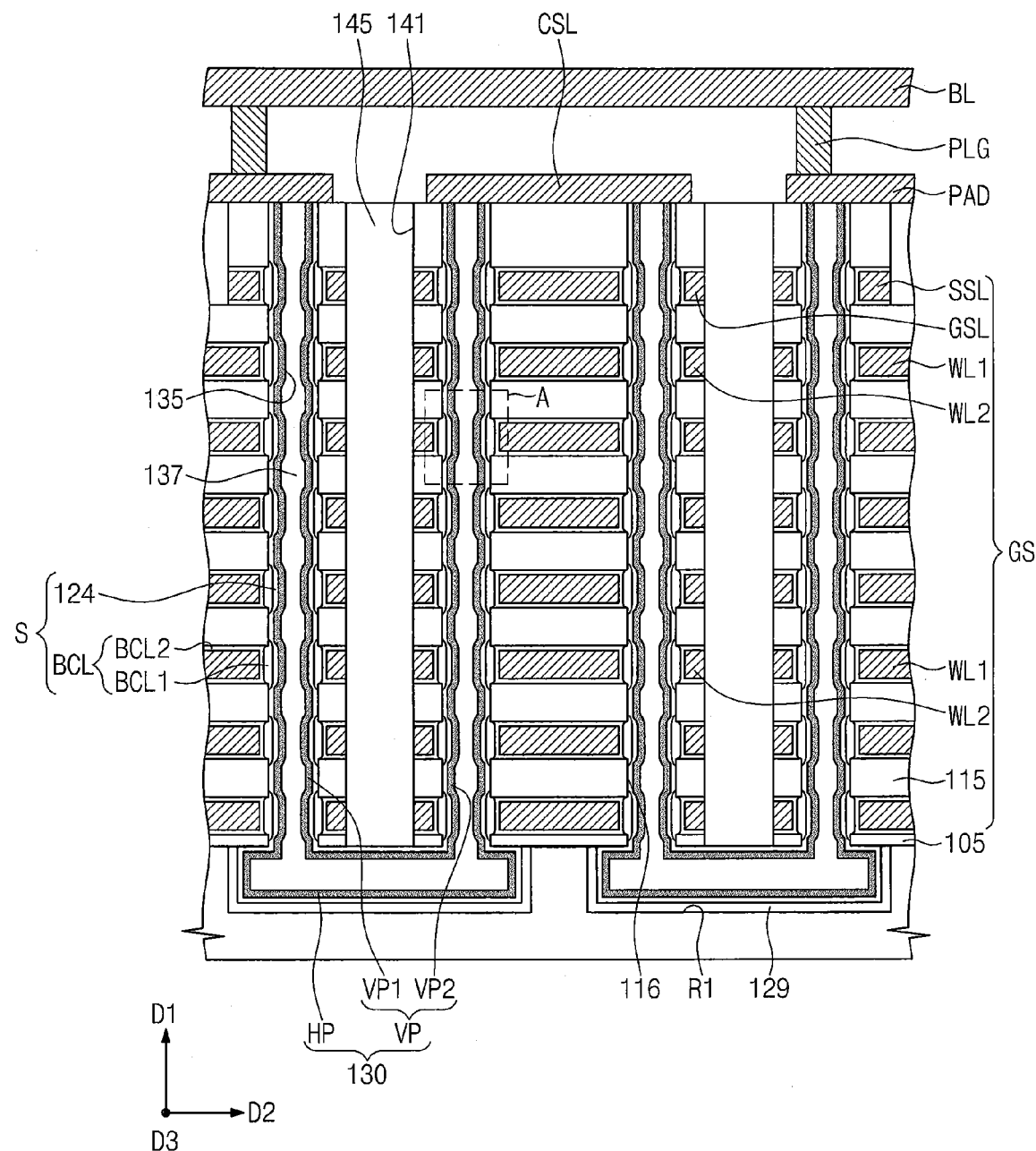
FIG. 17A is a sectional view illustrating a semiconductor device according to still other example embodiments of the inventive concepts.
Figure 17B:
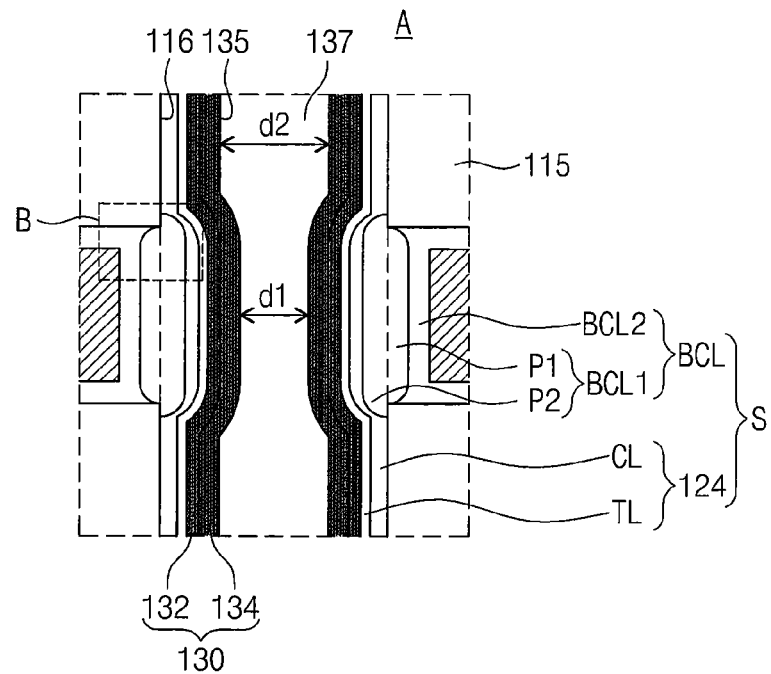
FIG. 17B is an enlarged view illustrating a portion "A" of FIG. 17A, and FIGS. 17C and 17D are enlarged views illustrating a portion "B" of FIG. 17B.
Figure 17C:
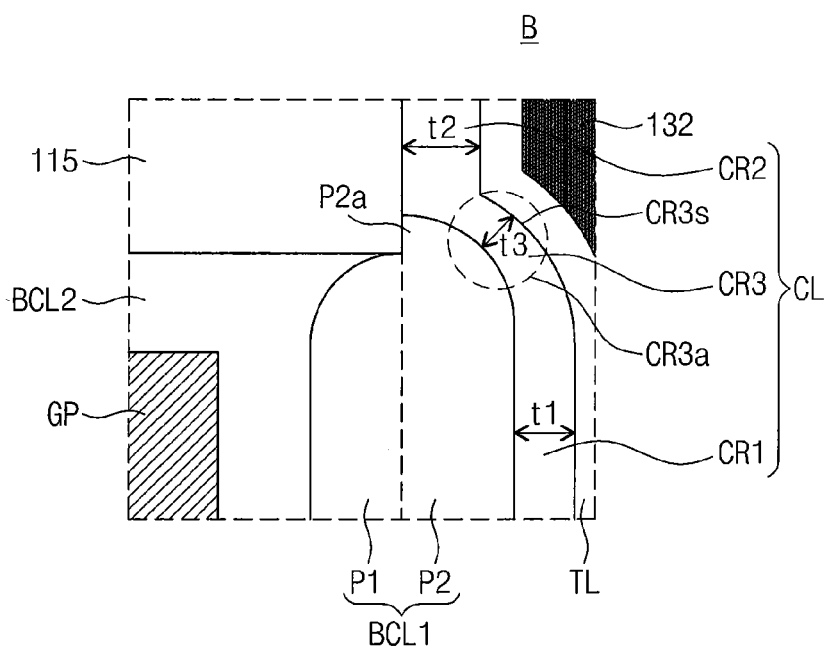
Figure 17D:
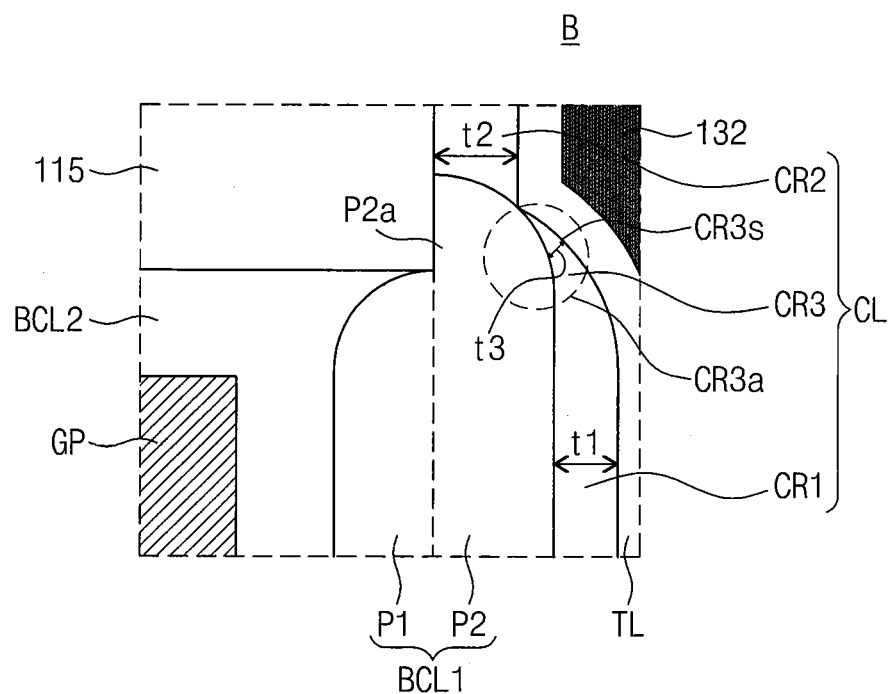

FIG. 17A is a sectional view illustrating a semiconductor device according to still other example embodiments of the inventive concept. FIG. 17B is an enlarged view illustrating a portion "A" of FIG. 17A, and FIGS. 17C and 17D are enlarged views illustrating a portion "B" of FIG. 17B. In the following description, a previously-described element may be identified by a similar or identical reference number without repeating an overlapping description thereof, for the sake of brevity.

Referring to FIGS. 17A and 17B, a semiconductor device according to the present embodiment may include bit lines BL on the substrate 100, a stack GS between the substrate 100 and the bit lines BL, the common source line CSL between the stack GS and the bit lines BL, and a plurality of the active pillars 130 passing through the stack GS. Each of the active pillars 130 may connect a corresponding one of the bit lines BL to the common source line CSL. Contact plugs PLG and pads PAD may be provided between the stack GS and the bit lines BL to provide electrical connection paths therebetween. The lower insulating layer 105 may be provided between the substrate 100 and the stack GS. The lower insulating layer 105 may include a silicon oxide layer.

The stack GS may extend along a first direction D1 (e.g., parallel to the substrate). In example embodiments, a plurality of stacks OS may be provided spaced apart from each other along a second direction D2 (for example, across or perpendicular to the first direction D1) by the isolation trench 141 extending the first direction D1. The stack GS may include the insulating patterns 115 and the gate patterns between the insulating patterns 115. The gate patterns may include at least one of doped silicon, metals (e.g., tungsten), metal nitrides, and metal silicides. The insulating patterns 115 may include a silicon oxide layer. The lower insulating layer 105 may have a smaller thickness than the insulating patterns 115.

The gate patterns may be sequentially formed on the substrate 100 (for example, in a vertical direction). The gate patterns may include a string selection line SSL, word lines, and a ground selection line GSL. The string selection line SSL may be disposed between word lines and the bit lines BL. The ground selection line GSL may be disposed between word lines and the common source line CSL. The word lines may be sequentially formed on the substrate 100. In the present embodiments, all of the string and ground selection lines SSL and GSL may be provided on the word lines WL. The string selection line SSL may be spaced apart from the ground selection line GSL in the second direction D2 by the isolation trench 141. The word lines may include the upper word lines WL1 between the substrate 100 and the string selection line SSL, and the lower word lines WL2 between the substrate 100 and the ground selection line GSL. The upper word lines WL1 may be spaced apart from the lower word lines WL2 in the second direction D2 by the isolation trench 141.

A device isolation pattern 145 may be provided between the string and ground selection lines SSL and GSL and between the upper word lines WL1 and the lower word lines WL2. The device isolation pattern 145 may have a linear shape and extend along the first direction D1. The device isolation pattern 145 may fill the isolation trench 141 and may include at least one of, for example, a silicon oxide layer, a silicon nitride layer, and/or a silicon oxynitride layer.

The plurality of the active pillars 130 may penetrate the stack GS. The active pillars 130 may be arranged along the first direction D1, when viewed in a plan view.

Each of the active pillars 130 may include vertical portions VP penetrating the stack GS and a horizontal portion HP provided below the stack GS to connect the vertical portions VP to each other. The vertical portions VP may be provided in the vertical holes 116 penetrating the stack GS. The horizontal portions HP may be provided in a horizontal recess R1 formed in a top portion of the substrate 100. One of the vertical portions VP may be connected to the common source line CSL, and another of the vertical portions VP may be connected to a corresponding one of the bit lines BL. The horizontal portion HP may be provided between the substrate 100 and the stack GS to connect the vertical portions VP to each other.

In detail, in each of the active pillars 130, the vertical portions VP may include a first vertical portion VP1 penetrating the upper word lines WL1 and the string selection line SSL and a second vertical portion VP2 penetrating the lower word lines WL2 and the ground selection line GSL. The first vertical portion VP1 may be connected to a corresponding one of the bit lines BL and the second vertical portion VP2 may be connected to the common source line CSL. The horizontal portion HP may extend from a region below the upper word lines WL1 toward a region below the lower word lines WL2, thereby connecting the first vertical portion VP1 to the second vertical portion VP2.

Each of the active pillars 130 may include a semiconductor pattern penetrating the stack GS. In each of the active pillars 130, the vertical portion VP of the semiconductor pattern may be provided to cover an inner side surface of the vertical hole 116 and the horizontal portion HP of the semiconductor pattern may be provided to cover an inner surface of the horizontal recess R1. The semiconductor pattern may include a semiconductor material. For example, the semiconductor pattern may include the same materials as the first and second semiconductor patterns 132 and 134 described in the previous embodiments.

Each of the active pillars 130 may have a tube-like shape and may have an internal space 135 defined therein. The internal space 135 of the active pillars 130 may be filled with an insulating gap-filling pattern 137. The insulating gap-filling pattern 137 may include a silicon oxide layer.

The data storing element S may be provided between the active pillars 130 and gate patterns. A gate insulating layer 129 may be provided between the active pillars 130 and the substrate 100. The gate insulating layer 129 may include a silicon oxide layer.

In still other example embodiments of the inventive concepts, the active pillars 130, the insulating gap-filling pattern 137, and the data storing element S may have features similar to those in the previous embodiments. For example, the data storing element S may include the vertical insulating pattern 124 and the blocking insulating region BCL. As described above, the vertical insulating pattern 124 may have a substantially perpendicular, but partially-bending, shape with respect to the top surface of the substrate 100. Furthermore, in the horizontal recess R1, the vertical insulating pattern 124 may further include a portion interposed between the gate insulating layer 129 and the active pillar 130 and between the stack GS and the active pillar 130. In other words, the vertical insulating pattern 124 may be provided in a single body continuously covering sidewalls of a pair of the active pillars 130 and the inner surface of the horizontal recess R1. As shown in FIGS. 17C and 17D, the data storage elements may have features as described above with reference to FIGS. 5C and 5D. Description of these features will not be repeated in light of the foregoing description of FIGS. 5C and 5D.

The following is an example of a method of fabricating a semiconductor device, according to even other example embodiments of the inventive concept. FIGS. 18A through 23A are sectional views illustrating a semiconductor device according to even other example embodiments of the inventive concept. FIGS. 18B through 23B are enlarged views illustrating portions "A" of FIGS. 18A through 23A, respectively. FIGS. 22C and 22D are enlarged views illustrating a portion "B" of FIG. 22B.

Figure 18A:
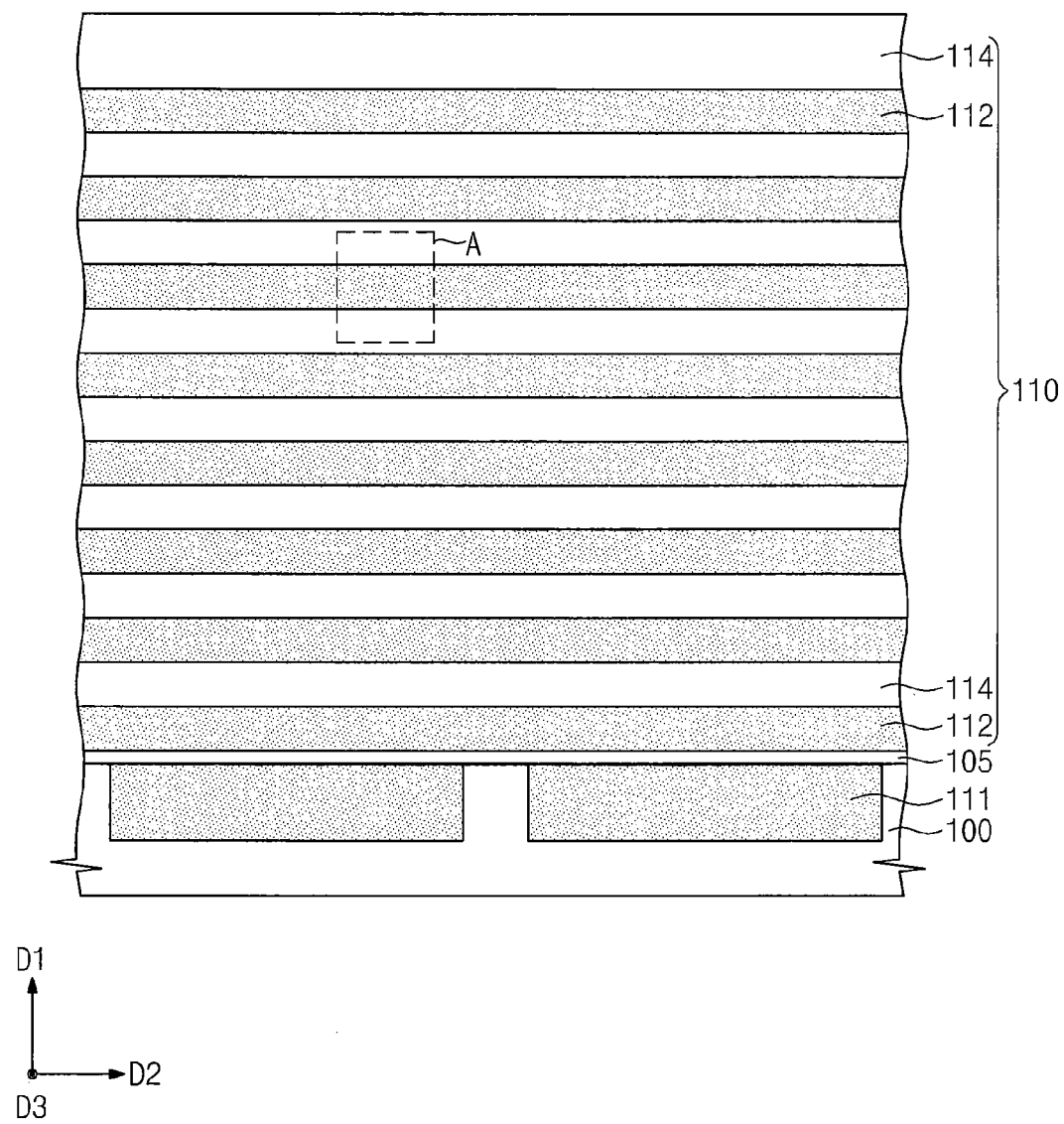
Figure 18B:
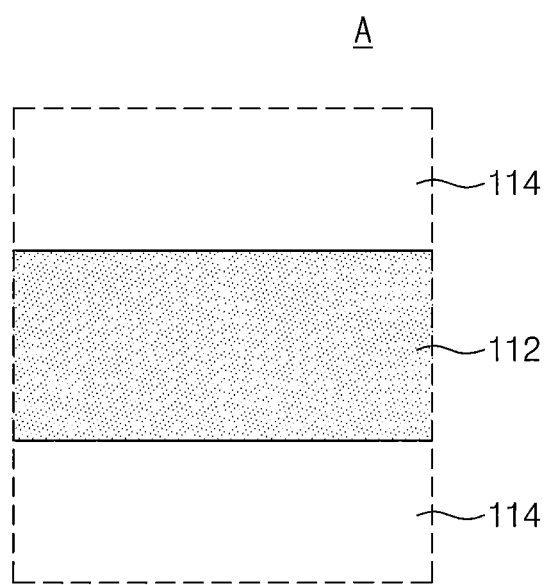

Referring to FIGS. 18A and 18B, the substrate 100 may be provided. The substrate 100 may be a semiconductor substrate having a first conductivity type (e.g., p-type). The semiconductor substrate may include at least one of a single crystalline silicon layer, a silicon on insulator (SOI) wafer, a silicon layer formed on a silicon germanium (SiGe) layer, a single crystalline silicon layer formed on an insulating layer, and a poly crystalline silicon layer formed on an insulating layer.

Buried sacrificial patterns 111 may be formed in the substrate 100, and then, the layered structure 110 may be formed on the substrate 100. The buried sacrificial patterns 111 may be formed of a material having an etch selectivity with respect to the layered structure 110. The buried sacrificial patterns 111 may include, for example, a silicon nitride layer, a silicon oxynitride layer, a germanium layer, and/or a silicon germanium layer. The buried sacrificial patterns 111 may be two-dimensionally arranged and each of them may have an island-shaped structure. The layered structure 110 may include the sacrificial layers 112 and the insulating layers 114 alternatively stacked on the substrate 100. The lower insulating layer 105 may be formed before the formation of the layered structure 110.

Figure 19A:
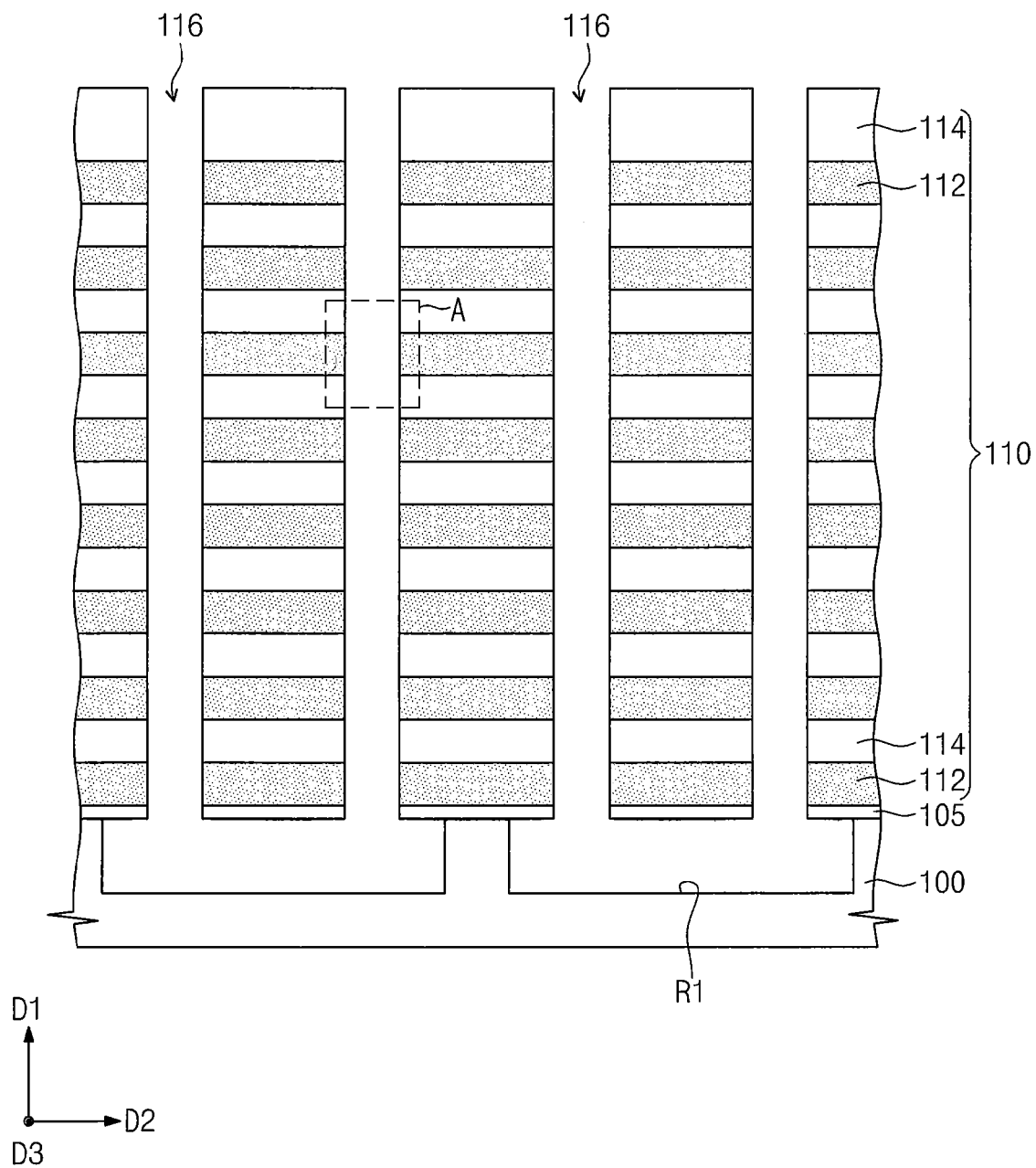
Figure 19B:
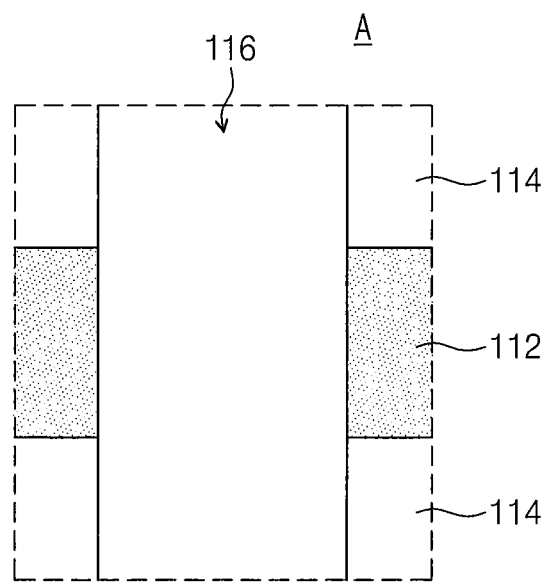

Referring to FIGS. 19A and 19B, the vertical holes 116 may be formed through the layered structure 110 and partially expose top surfaces of the buried sacrificial patterns 111. Furthermore, the buried sacrificial patterns 111 exposed may be selectively removed to form the horizontal recesses R1. A pair of the vertical holes 116 may be formed on each of the buried sacrificial patterns 111. Accordingly, the horizontal recess R1 and the pair of the vertical holes 116 may be connected to form a single string hole with a "U"-shaped cross section, as shown in FIG. 19A.

Figure 20A:
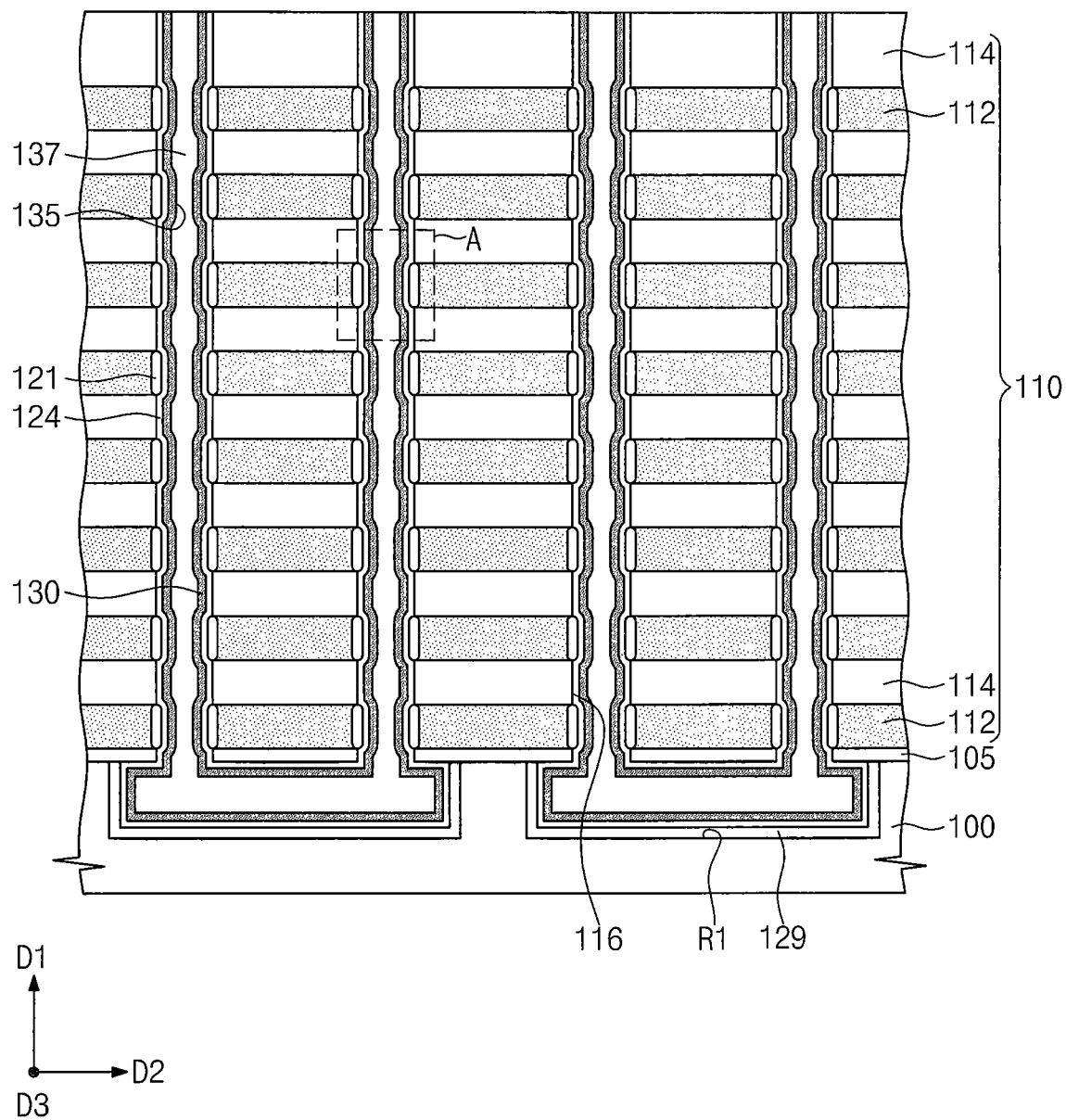
Figure 20B:
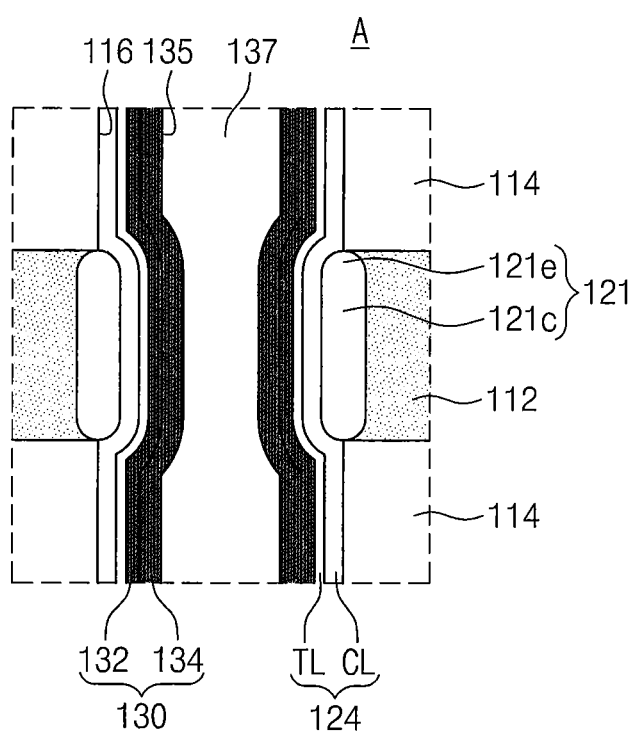

Referring to FIGS. 20A and 20B, the active pillars 130 may cover inner surfaces of the horizontal recess R1 and the vertical holes 116. As shown, the active pillars 130 may be formed not to completely fill the horizontal recess R1 and the vertical holes 116 (i.e., to define the internal space 135). The internal space 135 of the active pillars 130 may be filled with the insulating gap-filling pattern 137. The first preliminary blocking insulating regions 121 and the vertical insulating pattern 124 may be formed before the formation of the active pillars 130. In addition, the gate insulating layer 129 may be formed on the horizontal recess R1. When the first preliminary blocking insulating regions 121 is formed, the substrate 100 exposed by the horizontal recess R1 may be oxidized to form the gate insulating layer 129. The vertical insulating pattern 124 may continuously cover the sidewalls of a pair of the active pillars 130 and the inner surface of the horizontal recess R1 and have a single body structure.

The active pillars 130, the insulating gap-filling pattern 137, the first preliminary blocking insulating regions 121, and the vertical insulating pattern 124 may be formed using a method similar to that described with reference to FIGS. 7A and 7B and FIGS. 9A through 10B.

Figure 21A:
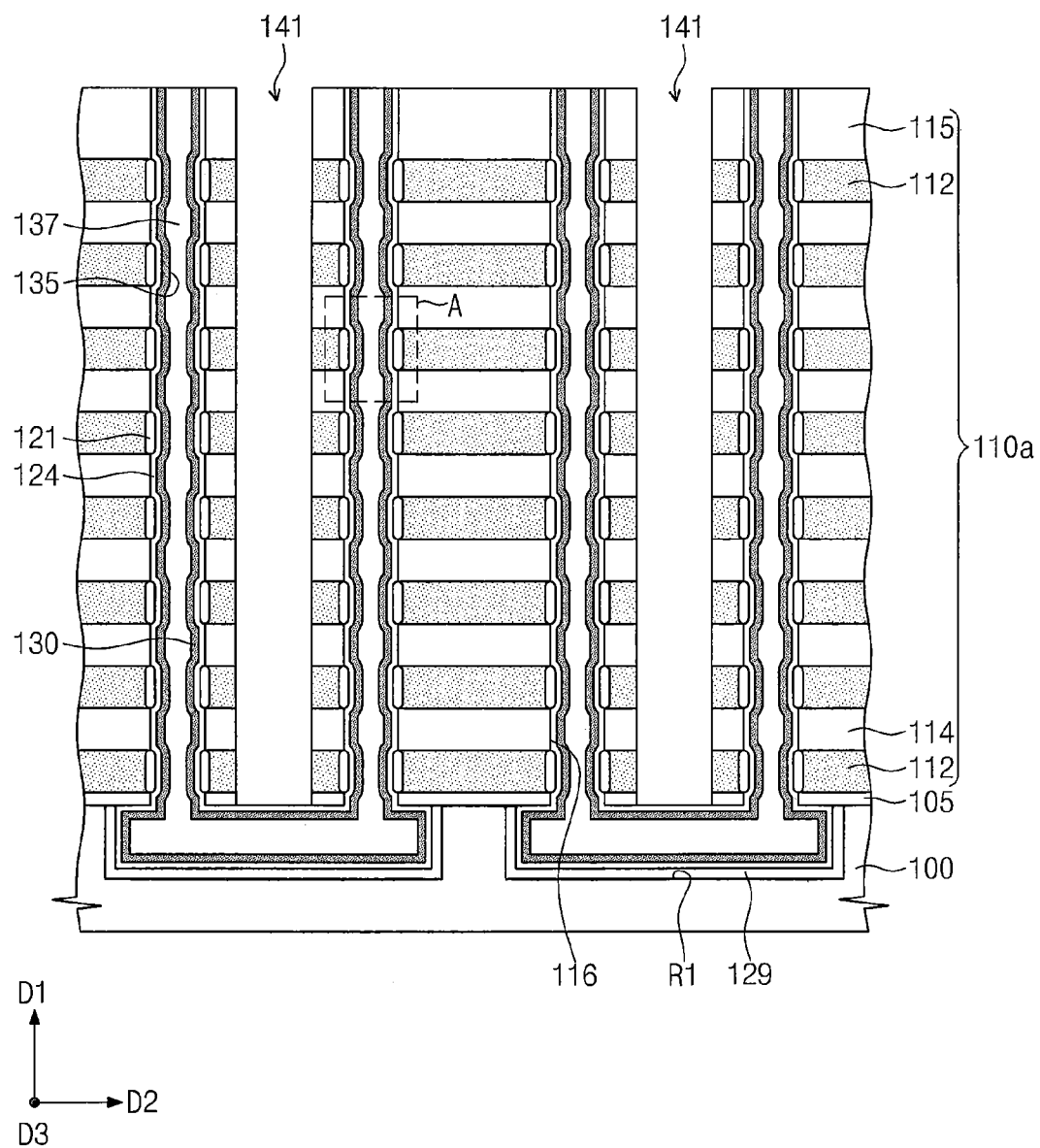
Figure 21B:
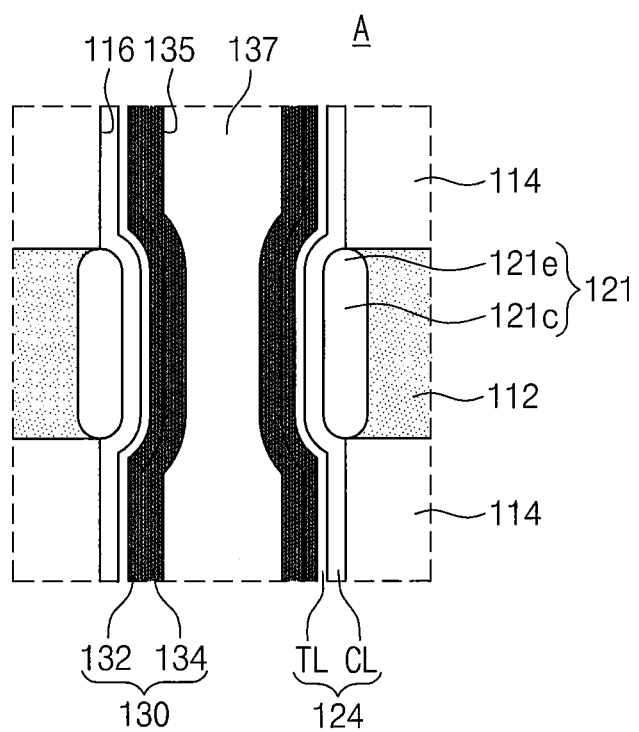
Figure 22A:
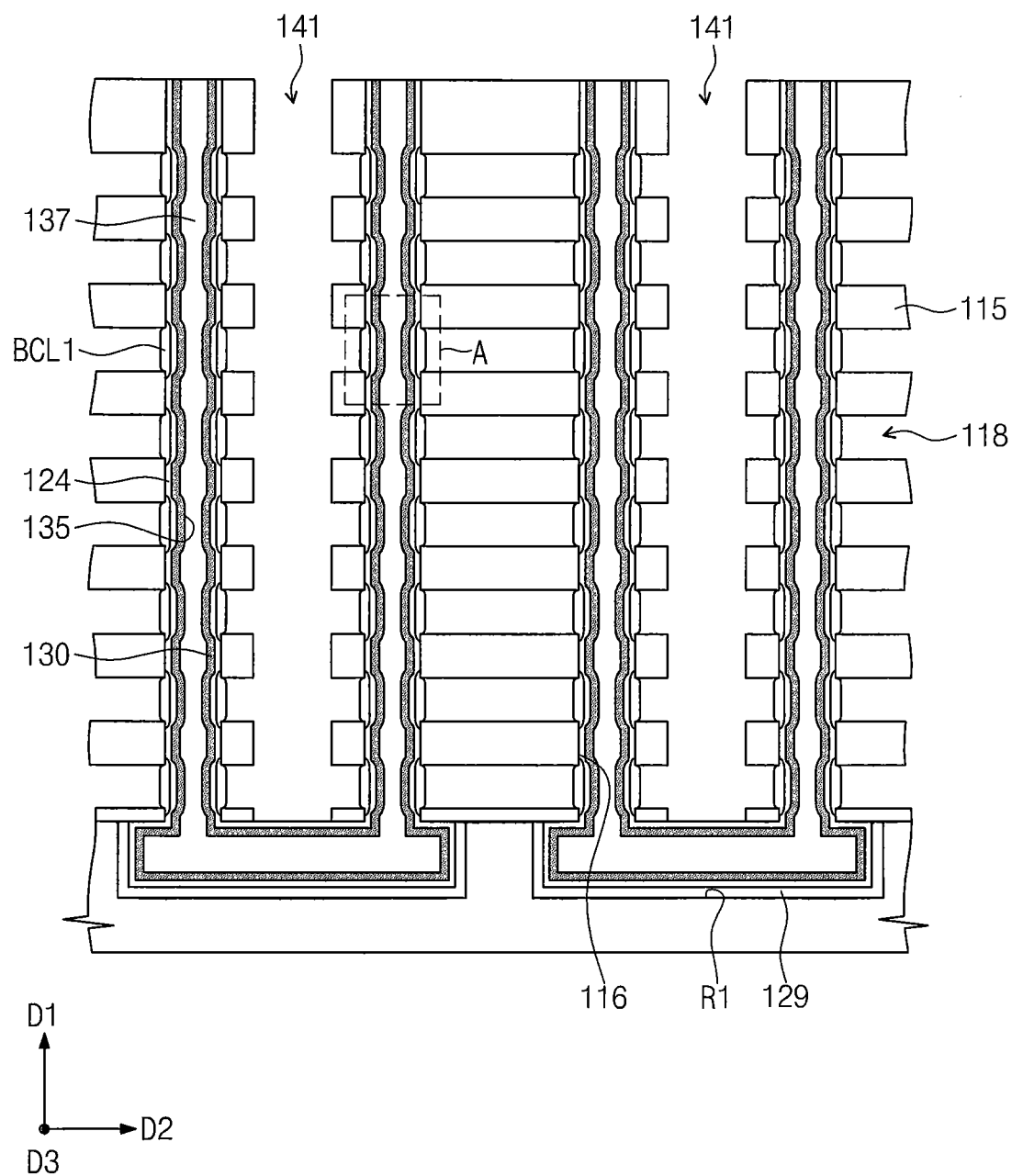
Figure 22B:
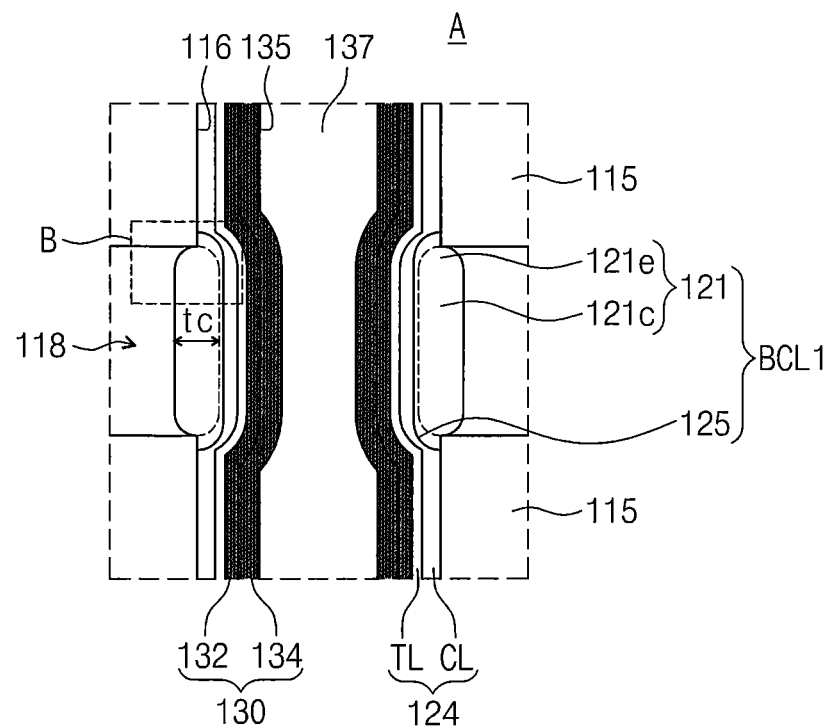
Figure 22C:
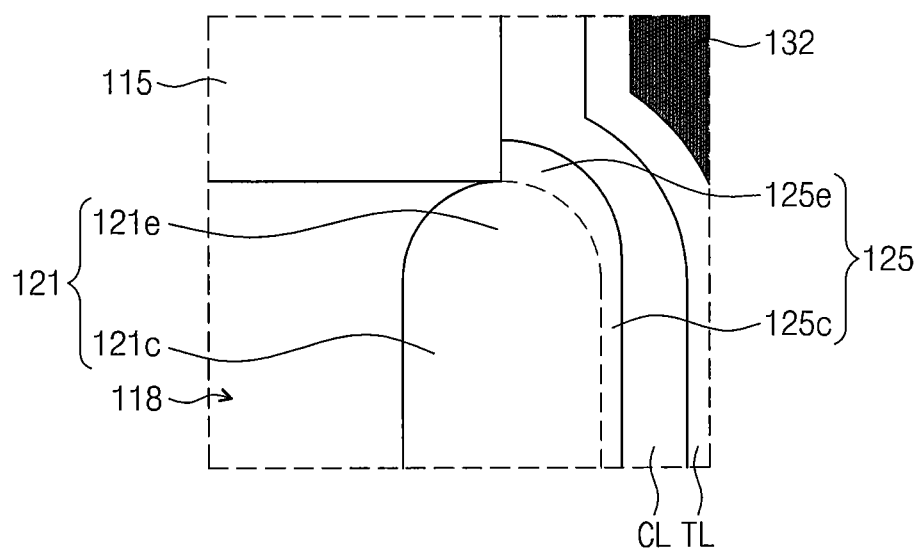
FIGS. 22C and 22D are enlarged views illustrating a portion "B" of FIG. 22B.
Figure 22D:
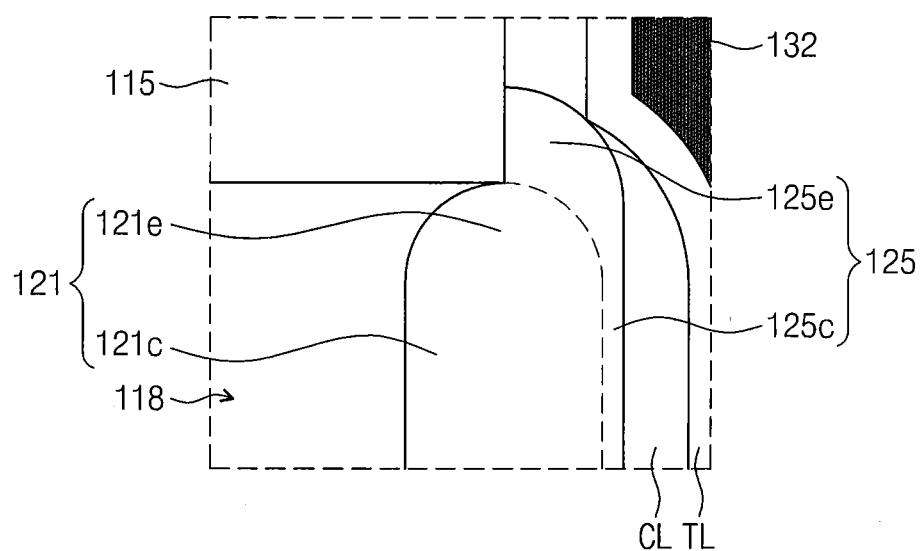

Referring to FIGS. 21A and 21B, the layered structure 110 may be patterned to form the isolation trench 141 crossing the horizontal recess R1. The isolation trench 141 may be formed between a pair of the vertical holes 116 connected to a corresponding one of the horizontal recess R1. As a result of the formation of the isolation trench 141, the sacrificial layers 112 and the insulating layers 114 may be patterned to form preliminary stacks 110a. The insulating patterns 115 may refer to patterned structures of the insulating layers 114.

Referring to FIGS. 22A through 22D, the sacrificial layers 112 exposed by the isolation trench 141 may be selectively removed to form recesses 126.

Thereafter, the charge storing layer CL may be partially oxidized to form the second preliminary blocking insulating regions 125. The second preliminary blocking insulating regions 125 may be formed using a method similar to that described with reference to FIGS. 13A and 13B. As a result, the first blocking insulating region BCL1 including the first and second preliminary blocking insulating regions 121 and 125 may be formed.

Figure 23A:
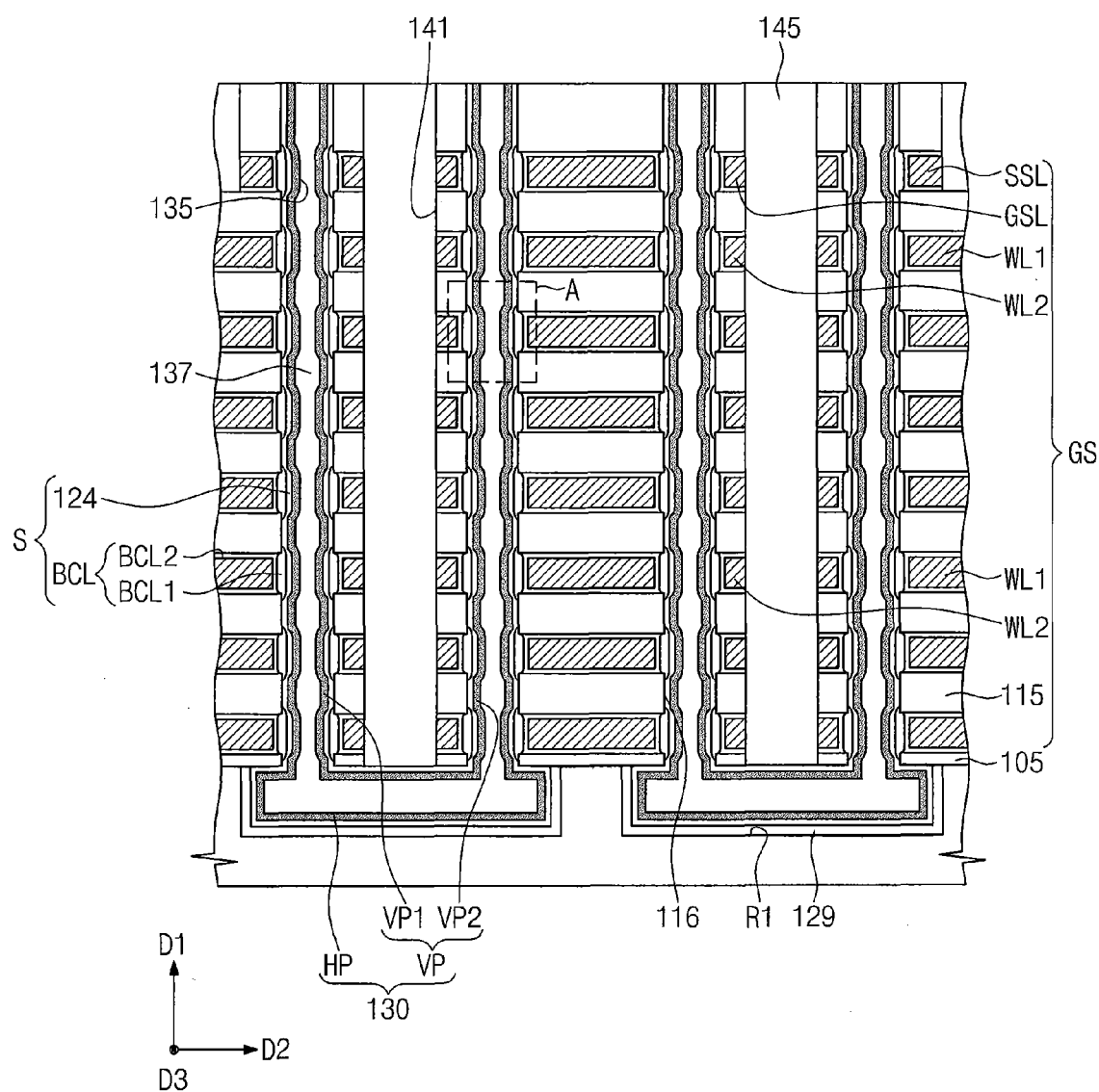
Figure 23B:
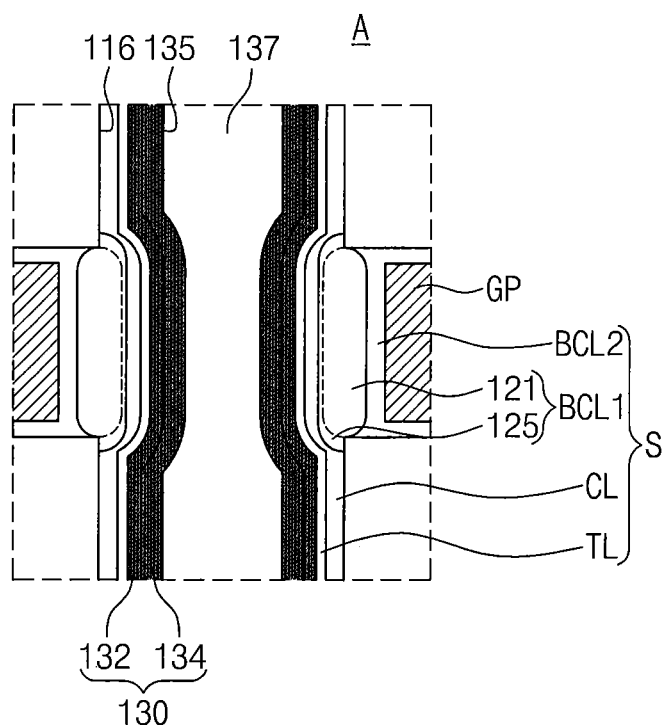

Referring to FIGS. 23A and 23B, by supplying a conductive material through the isolation trench 141, conductive patterns (not shown) may be formed in the recesses 126. The conductive patterns may include at least one of, for example, a doped poly-silicon layer, a metal layer (e.g., tungsten), and a metal nitride layer. For example, the conductive layer may include a metal nitride layer and a metal layer thereon. The second blocking insulating region BCL2 may be formed before the formation of the conductive patterns. The uppermost ones of the conductive patterns may be patterned to define the string selection line SSL. The string selection line SSL may be defined to be laterally spaced apart from the ground selection line GSL. The others of the conductive patterns positioned below the string and ground selection lines SSL and GSL may serve as the word lines. The isolation trench 141 may be filled with the device isolation pattern 145.

Referring back to FIGS. 17A through 17D, the pads PAD and the common source line CSL may be connected to the active pillars 130. Thereafter, the bit lines BL may be connected to the pads PAD. The contact plugs PLG may be provided between the bit lines BL and the pads PAD.

Figure 24:
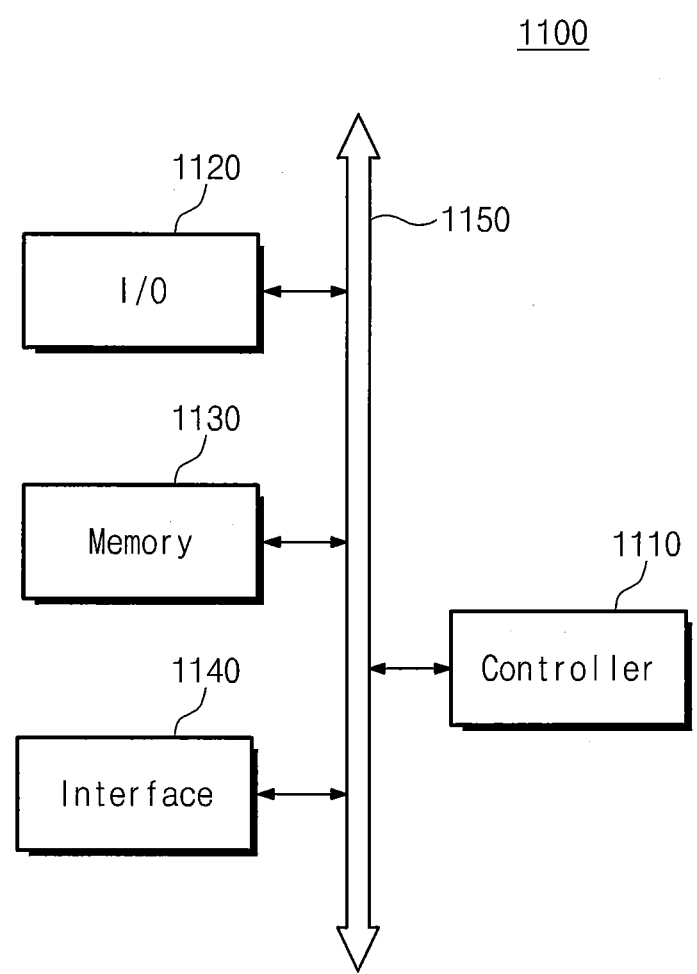
FIG. 24 is a schematic block diagram illustrating an example of an electronic system including a semiconductor device according to example embodiments of the inventive concepts.

FIG. 24 is a schematic block diagram illustrating an example of an electronic system including a semiconductor device according to example embodiments of the inventive concept.

Referring to FIG. 24, an electronic system 1100 according to example embodiments of the inventive concept may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted. The memory device 1130 may include at least one of the semiconductor memory devices according to example embodiments of the inventive concept.

The controller 1110 may include at least one of a microprocessor, a digital signal processor, a microcontroller, and another logic device, which is configured to have a similar function to them. The I/O unit 1120 may include a keypad, a keyboard, and a display unit. The memory device 1130 may store data and/or commands. The interface unit 1140 may transmit electrical data to a communication network or may receive electrical data from a communication network. The interface unit 1140 may operate in a wireless or wired manner. For example, the interface unit 1140 may include an antenna for the wireless communication or a transceiver for the wired and/or wireless communication. Although not shown in the drawings, the electronic system 1100 may further include a fast DRAM device and/or a fast SRAM device that acts as a cache memory for improving an operation of the controller 1110.

The electronic system 1100 may be applied to a personal digital assistant (PDA), a portable computer, a web tablet, a wireless phone, a mobile phone, a digital music player, a memory card or an electronic product. The electronic product may receive or transmit information data in a wireless manner.

Figure 25:
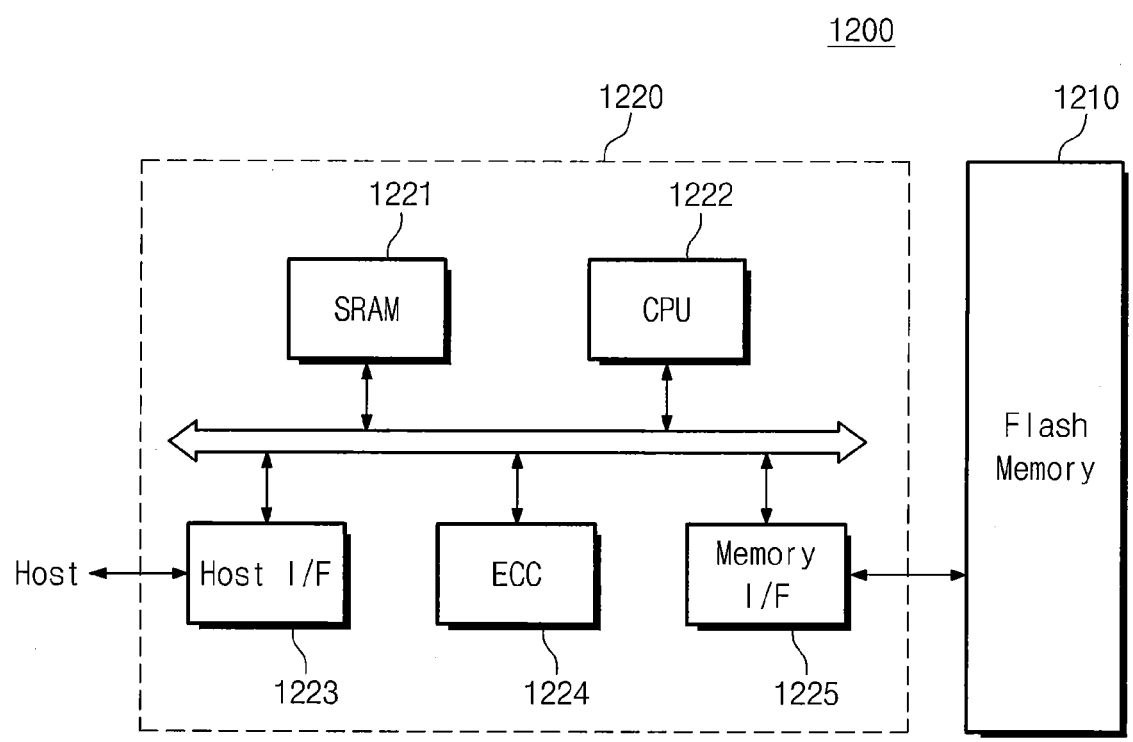
FIG. 25 is a schematic block diagram illustrating an example of a memory card including a semiconductor device according to example embodiments of the inventive concepts.

FIG. 25 is a schematic block diagram illustrating an example of a memory card including a semiconductor device according to example embodiments of the inventive concept.

Referring to FIG. 25, a memory card 1200 may include a memory device 1210. The memory device 1210 may include at least one of the semiconductor memory devices according to the afore-described embodiments of the inventive concept. In other embodiments, the memory device 1210 may further include a semiconductor memory device, which is of a different type from the semiconductor memory devices according to the afore-described embodiments of the inventive concept. For example, the memory device 1210 may further include a dynamic random access memory (DRAM) device and/or a static random access memory (SRAM) device. The memory card 1200 may include a memory controller 1220 that controls data communication between a host and the memory device 1210.

The memory controller 1220 may include a processing unit 1222 that controls overall operations of the memory card 1200. In addition, the memory controller 1220 may include an SRAM device 1221 used as an operation memory of the processing unit 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. The memory card 1200 may further include a read only memory (ROM) device that stores code data to interface with the host. The memory card 1200 may be used as a portable data storage card. Alternatively, the memory card 1200 may be provided in the form of a solid state drives (SSD), instead of hard disks of computer systems\.

Figure 26:
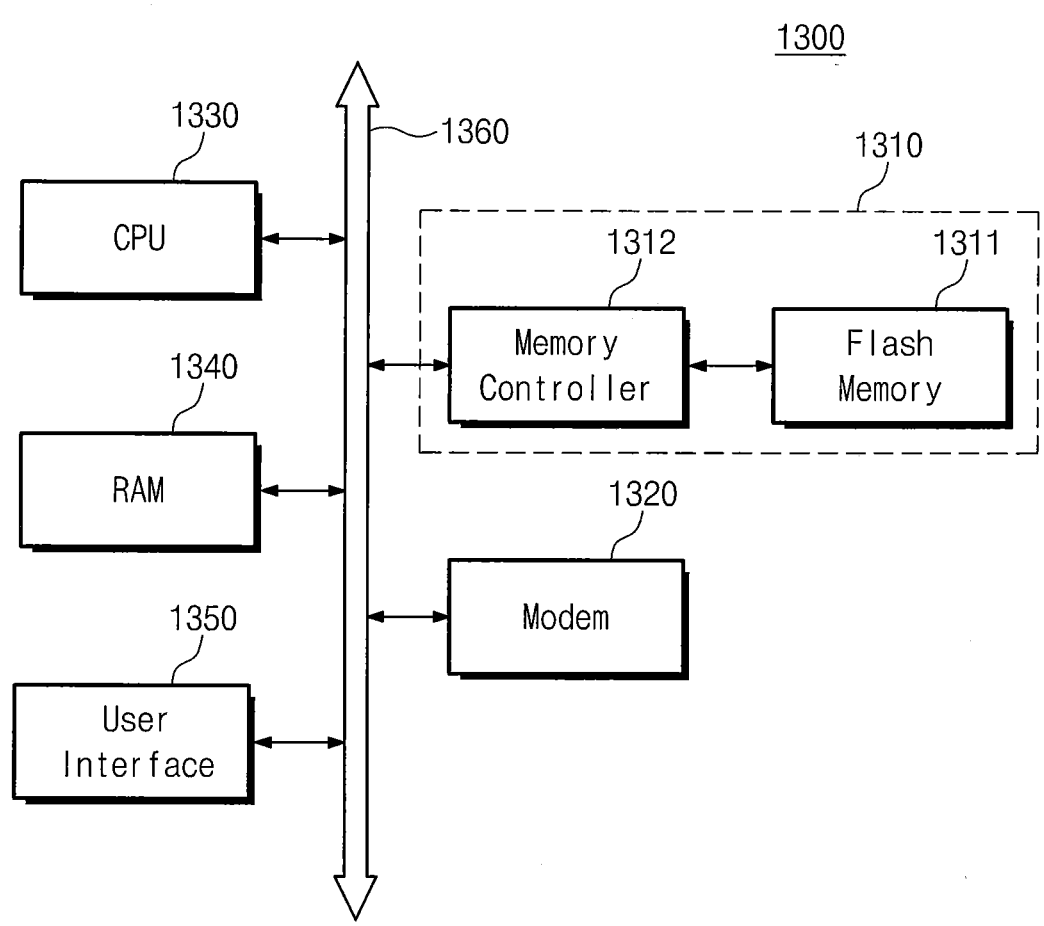
FIG. 26 is a schematic block diagram illustrating an example of an information processing system including a semiconductor device according to example embodiments of the inventive concepts.

FIG. 26 is a schematic block diagram illustrating an example of an information processing system including a semiconductor device according to example embodiments of the inventive concept.

Referring to FIG. 26, an information processing system 1300 may be provided as a mobile device, a desk top computer, or a part thereof. The memory system 1310 may include a memory device 1311 and a memory controller 1312 controlling an overall operation of the memory device 1311. The information processing system 1300 may include a memory system 1310 including at least one of the semiconductor memory devices according to example embodiments of the inventive concept. The information processing system 1300 also includes a modem 1320, a central processing unit (CPU) 1330, a RAM 1340, and a user interface 1350, which may be electrically connected to the memory system 1310 via a system bus 1360. Data processed by the CPU 1330 and/or input from the outside may be stored in the memory system 1310. The memory system 1310 may be provided as a solid state drive SSD, and thus, the information processing system 1300 may be able to store reliably a large amount of data in the memory system 1310. This increase in reliability of the memory system 1310 enables the information processing system 1300 to conserve resources for error correction and realize a high speed data exchange function. Although not illustrated, it is apparent to those skilled in the art that, for example, an application chipset, a camera image sensor, a camera image signal processor (ISP), an input/output device, or the like may further be included in the information processing system 1300 according to example embodiments of the inventive concept.

According to example embodiments of the inventive concept, a charge storing layer may penetrate gate patterns vertically stacked on a substrate and have a bending or winding profile. Furthermore, the charge storing layer may include a portion whose thickness is reduced at a region vertically spaced apart from the gate patterns. This makes it possible to prevent or suppress a vertical-type FLASH memory device from suffering from a vertical spreading of electric charges trapped in the charge storing layer. In other words, it is possible to reduce loss of electric charges stored in the charge storing layer and thereby improve a charge retention property of the vertical-type FLASH memory device. As a result, the vertical-type FLASH memory device can have improved reliability.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
a stack comprising insulating patterns vertically stacked on a substrate and gate patterns interposed between the insulating patterns;
an active pillar passing through the stack and electrically connected to the substrate; and
a charge storing layer interposed between the stack and the active pillar, the charge storing layer comprising a first portion between the active pillar and one of the gate patterns, a second portion between the active pillar and one of the insulating patterns, and a third portion joining the first portion to the second portion and having a thickness less than that of the first portion.

2. The semiconductor device of claim 1, wherein the first portion protrudes towards the active pillar in relation to the second portion.

3. The semiconductor device of claim 1, wherein the first portion is thinner than the second portion.

4. The semiconductor device of claim 1, wherein the first and second portions have substantially the same thickness.

5. The semiconductor device of claim 1, further comprising:
first blocking insulating regions between respective ones of the gate patterns and the charge storing layer; and
a tunnel insulating layer between the charge storing layer and the active pillar.

6. The semiconductor device of claim 5, wherein each of the first blocking insulating regions comprises a first portion positioned between vertically adjacent ones of the insulating patterns and a second portion extending horizontally from the first portion and protruding toward the active pillar.

7. The semiconductor device of claim 6, wherein each of the second portions of the first blocking insulating regions overlap adjacent ones of the insulating patterns.

8. The semiconductor device of claim 7, wherein the second portions of the first blocking insulating regions contact the tunnel insulating layer.

9. The semiconductor device of claim 5, further comprising second blocking insulating regions interposed between the gate patterns and the first blocking insulating regions, wherein the second blocking insulating regions comprise a material having a higher dielectric constant than that of the first blocking insulating regions.

10. The semiconductor device of claim 1, further comprising an insulating gap-filling pattern in an internal space of the active pillar.

11. The semiconductor device of claim 1, further comprising a lower semiconductor pattern interposed between the substrate and the active pillar and in contact with the substrate.

12. The semiconductor device of claim 1, wherein the active pillar comprises a first active pillar and further comprising a second active pillar passing through the stack and spaced apart from the first active pillar, wherein the first and second active pillars are electrically connected at bottom ends thereof.

13. A semiconductor device, comprising:
a stack comprising insulating patterns vertically stacked on a substrate and gate patterns interposed between the insulating patterns;
an active pillar passing through the stack and electrically connected to the substrate; and
a charge storing layer interposed between the stack and the active pillar and having spaced-apart protruding portions interposed between the gate patterns and the active pillar,
wherein the protruding portions have first and second end portions that are thinner than a middle portion of the protruding portion between the first and second end portions.

14. The semiconductor device of claim 13, further comprising blocking insulating regions disposed on sidewalls of respective ones of the gate patterns and protruding into the active pillar, and wherein the protruding portions of the charge storing layer are disposed on the blocking insulating regions.

15. A semiconductor device, comprising:
a stack comprising insulating patterns vertically stacked on a substrate and gate patterns interposed between the insulating patterns;
an active pillar passing through the stack and electrically connected to the substrate;
a first blocking insulating region on a sidewall of one of the gate patterns and protruding towards the active pillar;
a charge storing layer on the first blocking insulating region and extending continuously on to sidewalls of first and second ones of the insulating patterns adjacent the first blocking insulating region, the charge storing layer having first and second portions overlying locations where the first blocking insulating region contacts the first and second ones of the insulating patterns that are thinner than a third portion of the charge storing layer on the first blocking insulation region between the first and second portions; and
a tunnel insulating layer interposed between the charge storing layer and the active pillar.

16. The semiconductor device of claim 15, wherein the first blocking insulating region extends into a space between the first and second ones of the insulating patterns.

17. The semiconductor device of claim 16, further comprising a second blocking insulating region interposed between the gate patterns and the first blocking insulating region and comprising a material having a dielectric constant greater than that of the first blocking insulating region.

18. The semiconductor device of claim 15, wherein the charge storing layer comprises a portion that protrudes toward the active pillar between the active pillar and the one of the gate patterns.

* * * * *